United States Patent
Homma et al.

(10) Patent No.: US 10,466,283 B2
(45) Date of Patent: Nov. 5, 2019

(54) TRAINING DATA GENERATION DEVICE, ELECTRICAL DEVICE MONITORING SYSTEM, TRAINING DATA GENERATION METHOD, AND NON-TRANSITORY STORAGE MEDIUM

(71) Applicant: NEC Corporation, Tokyo (JP)

(72) Inventors: Kosuke Homma, Tokyo (JP); Eisuke Saneyoshi, Tokyo (JP); Ryo Hashimoto, Tokyo (JP); Takahiro Toizumi, Tokyo (JP)

(73) Assignee: NEC Corporation, Tokyo (JP)

( * ) Notice: Subject to any disclaimer, the term of this patent is extended or adjusted under 35 U.S.C. 154(b) by 431 days.

(21) Appl. No.: 15/300,531

(22) PCT Filed: Mar. 17, 2015

(86) PCT No.: PCT/JP2015/057829
§ 371 (c)(1),
(2) Date: Sep. 29, 2016

(87) PCT Pub. No.: WO2015/151789
PCT Pub. Date: Oct. 8, 2015

(65) Prior Publication Data
US 2017/0184643 A1    Jun. 29, 2017

(30) Foreign Application Priority Data
Mar. 31, 2014 (JP) .................................. 2014-071120

(51) Int. Cl.
*G01R 21/133* (2006.01)
*G06F 17/18* (2006.01)
(Continued)

(52) U.S. Cl.
CPC ....... *G01R 21/133* (2013.01); *G01R 19/2509* (2013.01); *G01R 19/2513* (2013.01);
(Continued)

(58) Field of Classification Search
CPC ............... G01D 4/002; G01R 19/2509; G01R 19/2513; G01R 21/133; G05B 23/0235;
(Continued)

(56) References Cited

U.S. PATENT DOCUMENTS

2011/0307200 A1* 12/2011 Hsu .................. G06Q 50/06
702/61
2012/0004871 A1  1/2012 Tsao et al.
2015/0151560 A1  6/2015 Marinkin et al.

FOREIGN PATENT DOCUMENTS

JP        3403368       5/2003
JP     2006-353005 A    12/2006
(Continued)

OTHER PUBLICATIONS

International Search Report and Written Opinion dated Jun. 23, 2015, in corresponding PCT International Application.
(Continued)

*Primary Examiner* — John H Le
(74) *Attorney, Agent, or Firm* — Finnegan, Henderson, Farabow, Garrett & Dunner, L.L.P.

(57) ABSTRACT

A training data generation device (10) includes: a measurement data acquisition unit (11) that acquires measurement data including waveform data including at least one of a current consumption waveform, an input voltage waveform, and a power consumption waveform along a time axis of an electrical device and power consumption value data indicating time-series power consumption values of the electrical device; an analysis unit (12) that analyzes a rate of occurrence of each power consumption value using the power consumption value data; a specifying unit (13) that specifies one or more specific power consumption value bands including a power consumption value with the higher rate of occurrence than that of a standard power consumption value and having a predetermined power value width; a feature amount extraction unit (14) that determines a representative power value for each specific power consumption value band and extracts a feature amount using the waveform data; and a storage unit (15) that stores a pair of the representative power value determined based on each specific power consumption value band and a training feature amount which is the feature amount in association with the electrical device.

10 Claims, 17 Drawing Sheets

(51) Int. Cl.
  *G05B 23/02* (2006.01)
  *G05B 9/02* (2006.01)
  *G01R 19/25* (2006.01)
  *G06F 15/18* (2006.01)
  *G05B 19/042* (2006.01)
  *G06N 20/00* (2019.01)
  *G01D 4/00* (2006.01)

(52) U.S. Cl.
  CPC ............ *G05B 9/02* (2013.01); *G05B 19/042* (2013.01); *G05B 23/0235* (2013.01); *G05B 23/0254* (2013.01); *G05B 23/0272* (2013.01); *G06F 17/18* (2013.01); *G01D 4/002* (2013.01); *G06N 20/00* (2019.01); *Y02B 70/3266* (2013.01); *Y02B 90/241* (2013.01); *Y02B 90/248* (2013.01); *Y04S 20/242* (2013.01); *Y04S 20/32* (2013.01); *Y04S 20/52* (2013.01)

(58) Field of Classification Search
  CPC .. G05B 23/0254; G05B 23/0272; G05B 9/02; G06F 17/18; G06N 20/00; Y02B 70/3266; Y02B 90/241; Y02B 90/248; Y04S 20/242; Y04S 20/32; Y04S 20/52

USPC ..................................................... 702/60, 61
See application file for complete search history.

(56) References Cited

FOREIGN PATENT DOCUMENTS

| | | |
|---|---|---|
| JP | 2008-039492 A | 2/2008 |
| JP | 4433890 | 3/2010 |
| JP | 4565511 | 10/2010 |
| JP | 2011-232061 A | 11/2011 |
| JP | 2012-16270 | 1/2012 |
| JP | 2013-009500 A | 1/2013 |
| JP | 2013-081683 A | 5/2013 |
| JP | 2014-16844 | 1/2014 |
| WO | WO 2014/042147 A1 | 3/2014 |
| WO | WO 2015/151558 A1 | 10/2015 |

OTHER PUBLICATIONS

Japanese Patent Office Decision to Grant a Patent with Translation dated Dec. 11, 2018 in counterpart Japanese Patent Application No. 2016-511512.

* cited by examiner

FIG. 5

| ID | POWER VALUE BAND | REPRE-SENTATIVE VALUE | FEATURE AMOUNT |
|---|---|---|---|
| D 1 | EQUAL TO OR GREATER THAN 610 W AND EQUAL TO OR LESS THAN 615 W | 612.5w | ○×○ |
| D 2 | EQUAL TO OR GREATER THAN 733 W AND EQUAL TO OR LESS THAN 738 W | 735.5w | □□× |
| ⋮ | ⋮ | ⋮ | ⋮ |
| D n | EQUAL TO OR GREATER THAN 1107 W AND EQUAL TO OR LESS THAN 1112 W | 1109.5w | ○×× |

FIG. 6

| ELECTRICAL DEVICE ID | TRAINING ID | REPRE-SENTATIVE VALUE | FEATURE AMOUNT |
|---|---|---|---|
| 000001 | 000001-001 | 2.5w | ○○○ |
| 000001 | 000001-002 | 7.5w | ×××　 |
| ⋮ | ⋮ | ⋮ | ⋮ |

FIG. 9

| TOTAL POWER CONSUMPTION | 2500w |
| --- | --- |
| AIR-CONDITIONER | 1000w |
| DRYER | 900w |
| REFRIGERATOR | 200w |
| ⋮ | |

| ID | POWER VALUE BAND | REPRE-SENTATIVE VALUE | FEATURE AMOUNT |
|---|---|---|---|
| D 1 | GREATER THAN 0 W AND EQUAL TO OR LESS THAN 5 W | 2.5w | ○○○ |
| D 2 | GREATER THAN 5 W AND EQUAL TO OR LESS THAN 10 W | 7.5w | ××× |
| ⋮ | ⋮ | ⋮ | ⋮ |
| D 240 | GREATER THAN 1195 W AND EQUAL TO OR LESS THAN 1200 W | 1197.5w | △△△ |

FIG. 15

| ID | POWER VALUE BAND | REPRE-SENTATIVE VALUE | FEATURE AMOUNT |
|---|---|---|---|
| R 1 | GREATER THAN 0 W AND EQUAL TO OR LESS THAN 50 W | 25w | × × |
| R 2 | GREATER THAN 50 W AND EQUAL TO OR LESS THAN 100 W | 75w | △ △ |
| ⋮ | ⋮ | ⋮ | ⋮ |
| R 10 | GREATER THAN 450 W AND EQUAL TO OR LESS THAN 500 W | 475w | ○○ |

FIG. 16

| ID | FEATURE AMOUNT |
|---|---|
| R1+D1 | ×○×○ |
| R2+D2 | ×△△× |
|  |  |
| ⋮ | ⋮ |
| R1+D1+A1 | ○○×× |
|  |  |

TRAINING DATA GENERATION DEVICE, ELECTRICAL DEVICE MONITORING SYSTEM, TRAINING DATA GENERATION METHOD, AND NON-TRANSITORY STORAGE MEDIUM

CROSS-REFERENCE TO RELATED PATENT APPLICATIONS

This application is a National Stage Entry of International Application No. PCT/JP2015/057829, filed Mar. 17, 2015, which claims priority from Japanese Patent Application No. 2014-071120, filed Mar. 31, 2014. The entire contents of the above-referenced applications are expressly incorporated herein by reference.

TECHNICAL FIELD

The present invention relates to a training data generation device, an electrical device monitoring system, a training data generation method, and a program.

BACKGROUND ART

In recent years, as smart meters and the like have become widespread, functions providing users with a total power consumption value (instantaneous value) in a predetermined unit (a household, a company, a floor of one building, or the like) have been standardized. By providing not only the total power consumption value in the predetermined unit but also the power consumption value (instantaneous value) of a single electrical device used in the predetermined unit, measures for more precise power saving are expected to be prompted.

The power consumption value of an individual electrical device can be ascertained, for example, by mounting a measuring instrument on each electrical device. However, in the case of this method, a burden of mounting a measuring instrument on each electrical device is considerable. Further, a cost burden increases since the number of measurement instruments increases with an increase in the number of electrical devices.

Patent Documents 1 and 2 disclose technologies for installing a measuring instrument in a power trunk line portion such as a power-feeding service entrance or a distribution board and inferring an operation state of each electrical device using measurement data (a total current consumption waveform or the like) measured with the measuring instrument. In the technologies, a feature amount (a training feature amount) during operation of each electrical device is prepared in advance and a sum training feature amount in which the training feature amounts are summed in any combination is further prepared in advance. Then, based on feature amounts extracted from the measurement data measured in the power trunk line portion and the training feature amounts (including the sum training feature amount) prepared in advance, an operation state of each electrical devices is inferred.

Patent Document 3 discloses a technology for generating a training feature amount indicating a feature amount during operation of each electrical device. Specifically, pieces of predetermined data (current consumption or the like) are individually measured by operating electrical devices in a house to be measured one by one. A feature amount is extracted from the measured data of each of the electrical devices and the extracted feature amount is stored as a training feature amount.

RELATED DOCUMENT

Patent Document

[Patent Document 1] Japanese Patent No. 3403368
[Patent Document 2] Japanese Patent No. 4565511
[Patent Document 3] Japanese Patent No. 4433890

SUMMARY OF THE INVENTION

Technical Problem

The present inventors have examined technologies for calculating power consumption values (instantaneous values) of monitoring electrical devices using measurement data measured in power trunk line portions. As a result of the examination, the present inventors have found new problems. Hereinafter, the examined processes and the new problems will be described.

Training data of each electrical device was generated as follows. First, a power consumption value band (greater than 0 W and equal to or less than the rated power) which can be actually consumed by a first electrical device is divided into a predetermined number of groups. Then, a representative power value and a feature amount (training feature amount) were determined for each group. All of the representative power values and the training feature amounts of the groups determined in this way are training data of the first electrical device.

FIG. 13 illustrates examples of the training data generated in the foregoing way. FIG. 13 illustrates the training data of a dryer having a consumable power consumption value band of greater than 0 W and equal to or less than 1200 W. In the training data, the power consumption value band is divided into 240 groups in units of 5 W. A representative power value which is a median value of each power value band and a feature amount (training feature amount) extracted from a current consumption waveform during power consumption in each power value band are associated with each group. That is, each training feature amount is a feature amount when the dryer consumes the power in each power value band.

FIG. 14 is a diagram illustrating the concept of a process of generating the training data illustrated in FIG. 13. From the drawing, it is possible to comprehend that a range of greater than 0 W and equal to or less than 1200 W which is a power consumption value band consumable by the dryer is divided into 240 groups in units of 5 W, and the representative power value and the feature amount are determined for each group.

FIG. 15 illustrates training data of a refrigerator having a consumable power consumption value band of greater than 0 W and equal to or less than 500 W. In the training data, the power consumption value band is divided into 10 groups in units of 50 W. A representative power value which is a median value of each power value band and a feature amount (training feature amount) extracted from a current consumption waveform during power consumption in each power value band are associated with each group.

After the training data illustrated in FIGS. 13 and 15 is generated for each monitoring electrical device, as illustrated in FIG. 16, sum training data including a sum training feature amount in which the training feature amounts are mutually added is generated. The sum training data includes not only the sum training feature amount but also information identifying the electrical device corresponding to the mutually added training feature amounts and the power consumption value band.

The feature amount associated with an ID "R 1+D 1" (R representing the refrigerator and D representing the dryer) illustrated in FIG. 16 is a feature amount in which the training feature amount of "D 1" illustrated in FIG. 13 and the training feature amount of "R 1" illustrated in FIG. 15 are mutually added. The sum training feature amount is a feature amount observed when the dryer is consuming power in a range of greater than 0 W and equal to or less than 5 W, the refrigerator is consuming power in a range of greater than 0 W and equal to or less than 50 W, and no power is being consumed by other electrical devices. The sum training data is assumed to cover all of the combinations to be considered.

Thereafter, operation states of the monitoring electrical devices are monitored using such training data (including the sum training data). Specifically, a current waveform is measured in a power trunk line portion and feature amounts are extracted from measurement data. Then, the extracted feature amounts are collated with the training feature amounts (including the sum training feature amount) to specify the matching training feature amount.

For example, in a case in which the extracted feature amount matches the feature amount associated with the ID "R 1+D 1" illustrated in FIG. 16, an operation state of the electrical devices is specified as a state in which "the dryer is consuming power in a range of greater than 0 W and equal to or less than 5 W, the refrigerator is consuming power in a range of greater than 0 W and equal to or less than 50 W, and no power is being consumed by other electrical devices", is specified. In a case in which the extracted feature amount matches the feature amount associated with an ID "D 240" illustrated in FIG. 13, an operation state of the electrical devices is specified, "the dryer is consuming power in a range of greater than 1195 W and equal to or less than 1200 W and no power is being consumed by other electrical devices", is specified.

In the conventional technology, there is a problem that the number of pieces of training data (including the sum training data) is considerable. When the number of monitoring electrical devices increases, this problem becomes prominent. When the number of pieces of training data (including the sum training data) increases, not only does a burden on a process of generating the training data (including the sum training data) increases, but a burden on the capacity of a storage device storing the training data (including the sum training data) also increases. Further, a processing burden on a process of inferring the operation states of the monitoring electrical devices using the training data (including the sum training data) also increases.

As a method of reducing the number of pieces of training data (including the sum training data), a method of increasing the width of the power value band covered by each of the groups obtained by dividing the power consumption value band consumable by each electrical device and reducing the number of groups can be considered. For example, in the examples illustrated in FIGS. 13 and 14, the power consumption value band (greater than 0 W and equal to or less than 1200 W) consumable by the dryer is divided into 240 groups in units of 5 W, but an example in which the power consumption value band is divided into 12 groups in units of 100 W can be considered. However, when the number of groups is reduced, there is a concern of deterioration in the specifying precision of the operation state of each electrical device.

Accordingly, an object of the present invention is to provide a new technology for generating training data used to specify operation states of electrical devices.

Solution to Problem

According to an aspect of the present invention, there is provided a training data generation device including: a measurement data acquisition unit that acquires measurement data including waveform data including at least one of a current consumption waveform, an input voltage waveform, and a power consumption waveform along a time axis of an electrical device which is a target of a process of generating training data and power consumption value data indicating time-series power consumption values of the electrical device; an analysis unit that analyzes a rate of occurrence of each power consumption value using the power consumption value data; a specifying unit that specifies one or more specific power consumption value bands including a power consumption value with the higher rate of occurrence than that of a standard power consumption value and having a predetermined power value width; a feature amount extraction unit that determines a representative power value and extracts a feature amount using the waveform data for each specific power consumption value band; and a storage unit that stores a pair of the representative power value determined based on each specific power consumption value band and a training feature amount which is the feature amount in association with the electrical device.

According to another aspect of the present invention, there is provided an electrical device monitoring system including: the training data generation device; and a monitoring device that infers an operation state of each monitoring electrical device which is a monitoring target using the training feature amount of the electrical device generated by the training data generation device. The monitoring device includes a monitoring waveform data acquisition unit that acquires monitoring waveform data including at least one of a current consumption waveform, an input voltage waveform, and a power consumption waveform of the electrical device, a collation unit that performs a collation process using a monitoring feature amount which is a feature amount extracted from the monitoring waveform data and the training feature amount of the electrical device generated by the training data generation device, and an output unit that outputs the representative power value associated with the training feature amount matching the monitoring feature amount as the power consumption value of the electrical device.

According to still another aspect of the present invention, there is provided a program causing a computer to function as: a measurement data acquisition unit that acquires measurement data including waveform data including at least one of a current consumption waveform, an input voltage waveform, and a power consumption waveform along a time axis of an electrical device which is a target of a process of generating training data and power consumption value data indicating time-series power consumption values of the electrical device; an analysis unit that analyzes a rate of occurrence of each power consumption value using the power consumption value data; a specifying unit that specifies one or more specific power consumption value bands including a power consumption value with the higher rate of occurrence than that of a standard power consumption value and having a predetermined power value width; a feature amount extraction unit that determines a representative power value and extracts a feature amount using the waveform data for each specific power consumption value band; and a storage unit that stores a pair of the representative power value determined based on each specific power consumption value band and a training feature amount which is the feature amount in association with the electrical device.

According to still another aspect of the present invention, there is provided a training data generation method performed by a computer, the method including: a measurement data acquisition step of acquiring measurement data including waveform data including at least one of a current consumption waveform, an input voltage waveform, and a power consumption waveform along a time axis of an electrical device which is a target of a process of generating training data and power consumption value data indicating time-series power consumption values of the electrical device; an analysis step of analyzing a rate of occurrence of each power consumption value using the power consumption value data; a specifying step of specifying one or more specific power consumption value bands including a power consumption value with the higher rate of occurrence than that of a standard power consumption value and having a predetermined power value width; a feature amount extraction step of deciding a representative power value and extracting a feature amount using the waveform data for each specific power consumption value band; and a storage step of storing a pair of the representative power value determined based on each specific power consumption value band and a training feature amount which is the feature amount in association with the electrical device.

Advantageous Effects of Invention

According to the present invention, a new technology for generating training data used to specify operation states of electrical devices is realized.

BRIEF DESCRIPTION OF THE DRAWINGS

The above-described objects, other objects, features, and advantages will be apparent throughout preferred exemplary embodiments to be described below and the following drawings appended to the exemplary embodiments.

FIG. 5 is a diagram schematically illustrating an example of training data generated by the training data generation device according to the present exemplary embodiment.

FIG. 6 is a diagram schematically illustrating an example of training data generated by the training data generation device according to the present exemplary embodiment.

FIG. 9 is a flowchart illustrating an example of information output by the training data generating device and a monitoring device according to the exemplary embodiment.

FIG. 13 is a diagram schematically illustrating an example of training data generated in a comparison example.

FIG. 15 is a diagram schematically illustrating an example of training data generated in the comparison example.

Figure 16:
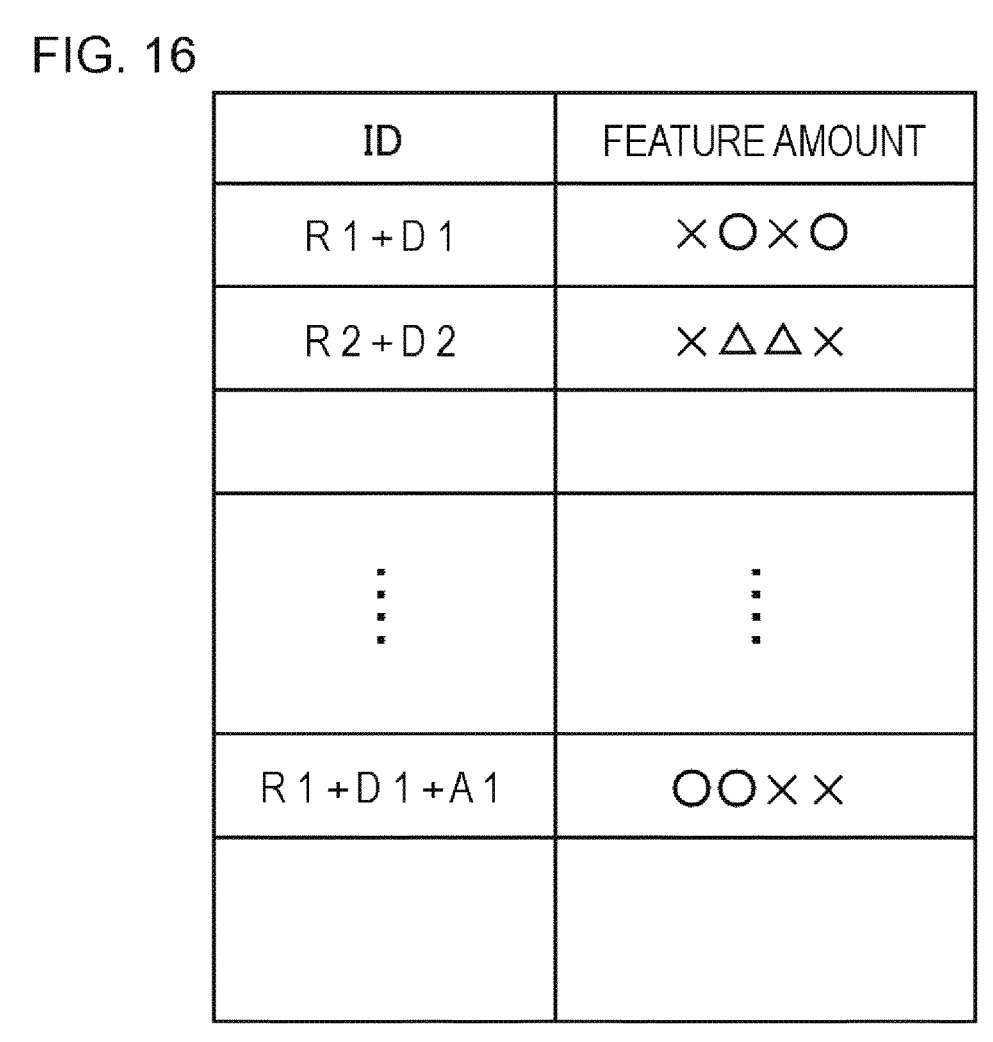

FIG. 16 is a diagram schematically illustrating an example of sum training data.

DESCRIPTION OF EXEMPLARY EMBODIMENTS

Hereinafter, a hardware configuration of a device according to a present exemplary embodiment will be described. Each unit included in the device according to the present exemplary embodiment is achieved by any combination of hardware and software with a focus on a central processing unit (CPU), a memory, a program loaded on the memory (also including a program which is stored in the memory in advance when shipping out the device and a program which is downloaded from a storage medium such as a compact disc (CD), or a server or the like on the Internet) of any computer, a storage unit such as a hard disk which stores the program, and an interface for network connection. In addition, those skilled in the art can understand that various modifications can be made to examples for achieving the method and device.

Figure 1:
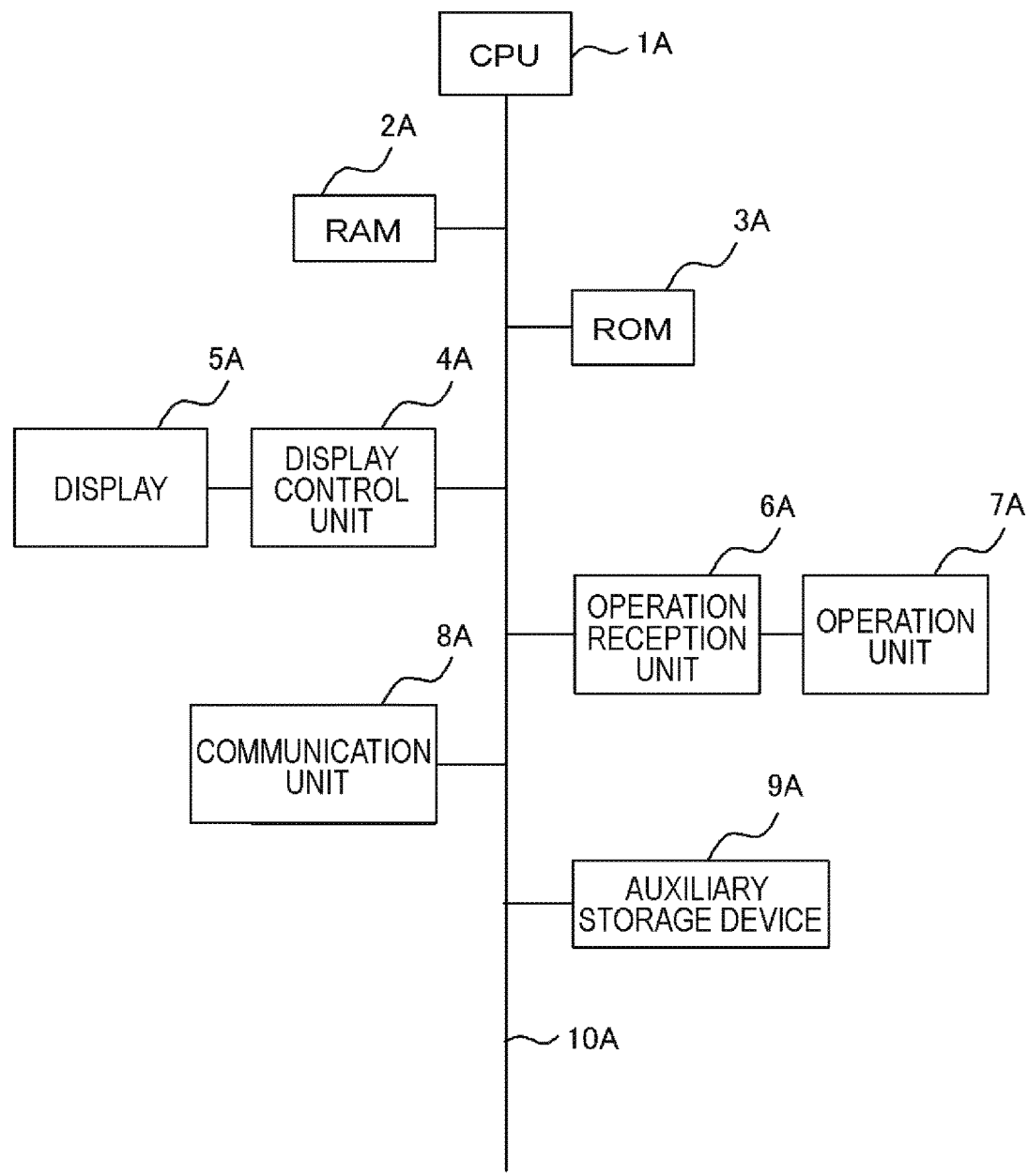
FIG. 1 is a diagram conceptually illustrating an example of a hardware configuration of a device according to a present exemplary embodiment.

FIG. 1 is a diagram conceptually illustrating an example of a hardware configuration of a device according to the present exemplary embodiment. As illustrated, the device according to the present exemplary embodiment includes, for example, a CPU 1A, a random access memory (RAM) 2A, a read-only memory (ROM) 3A, a display control unit 4A, a display 5A, an operation reception unit 6A, an operation unit 7A, a communication unit 8A, and an auxiliary storage device 9A connected to each other through a bus 10A. Although not illustrated, the device may additionally include other elements such as input and output interfaces connected to external devices in a wired manner, a microphone, and a speaker.

The CPU 1A controls each element and an entire computer of the device. The ROM 3A includes areas which store a program causing a computer to operate or various application program and various kinds of setting data used when such a program operates. The RAM 2A includes an area which temporarily stores data, such as a work area in which a program operate. The auxiliary storage device 9A is, for example, a hard disk drive (HDD) and can store large-volume data.

The display 5A is configured as, for example, a display device (for example, a light emitting diode (LED) display, a liquid crystal display, or an organic electroluminescence (EL) display). The display 5A may be a touch panel display integrated with a touch pad. The display control unit 4A reads data stored in a video RAM (VRAM), performs a predetermined process on the read data, and then transmits the data to the display 5A to display various screens. The operation reception unit 6A receives various operations through the operation unit 7A. The operation unit 7A includes an operation key, an operation button, a switch, a jog dial, a touch panel display, and a keyboard. The communication unit 8A is connected to a network such as the Internet or a local area network (LAN) in a wired and/or wireless manner to communicate with other electrical device.

Hereinafter, the present exemplary embodiment will be described. Functional block diagrams used to describe the following exemplary embodiments illustrate blocks in units of functions rather than configurations in units of hardware. In the drawings, each device is realized by a single device in the description, but realization methods are not limited thereto. That is, each device may, of course, have a physically divided configuration or a logically divided configuration. The same reference numerals are given to the same constituent elements and the description thereof will not be appropriately repeated.

<First Exemplary Embodiment>

Figure 2:
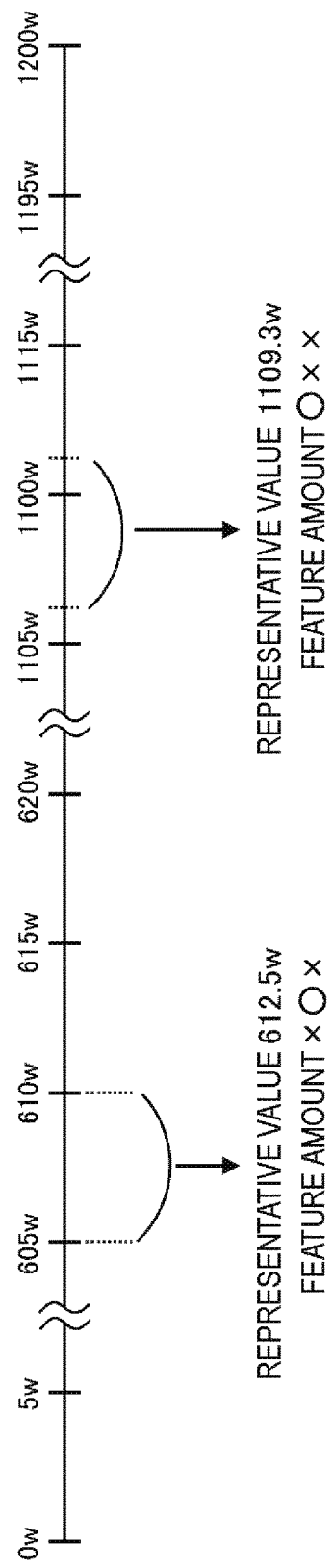
FIG. 2 is a diagram illustrating a training data generation method of a training data generation device according to the present exemplary embodiment.

First, an overview of a present exemplary embodiment will be described. In the present exemplary embodiment, as in the example illustrated in FIG. 14, groups (units in which representative power values and feature amounts are determined) are not set so that the power consumption value bands (greater than 0 W and equal to or less than the rated power) actually consumable by the electrical device are all covered. As illustrated in FIG. 2, groups (units in which representative power values and feature amounts are determined) are set so that the power consumption value bands (greater than 0 W and equal to or less than the rated power) are partially covered.

Specifically, a rate of occurrence of each power consumption value is first analyzed using measurement data which is measured to generate the training data. Thereafter, the group is set so that the power consumption value with a high rate of occurrence is included. Then, the training data corresponding to each group is generated. That is, only the training data corresponding to the power consumption value with a high rate of occurrence is generated and the training data corresponding to the power consumption value with a low rate of occurrence is not generated.

Many electrical devices have a plurality of operation modes and selectively operate in any one operation mode. For example, in the case of a dryer, operation modes such as "hot air (strong) mode", "hot air (weak) mode", and "cool air mode" are provided. In general, a power consumption value during each operation mode is within a substantially constant range. For example, when the operation mode is switched or a state is changed from a power-off state to any one operation mode, the power consumption value is instantaneously considerably changed and thus can be various values.

That is, an electrical device consumes power with various values in a range of a power consumption value band (greater than 0 W and equal to or less than the rated power) actually consumable by the electrical device. In a case in which an electrical device is used in a normal state, the electrical device consumes power with a power consumption value (a power consumption value corresponding to each operation mode) in a constant range at most usage timings and rarely consumes power with a power consumption value out of the range. Therefore, in the measurement data, various values are shown in the range of the power consumption value band (greater than 0 W and equal to or less than the rated power) actually consumable. There is a tendency that the rate of occurrence of the power consumption value corresponding to each operation mode is high and the rate of occurrence of the power consumption value out of the range is low.

In the present exemplary embodiment, groups (units in which representative power values and feature amounts are determined) are set so that power consumption values (power consumption values with a high rate of occurrence in the measurement data) shown when an electrical device is used in a normal state, that is, the power consumption values corresponding to respective operation modes, are included. The representative power value and the feature amount are determined for each group. Groups including power consumption values (power consumption values with a high rate of occurrence in the measurement data) rarely shown when an electrical device is used in the normal form are not set, and training data corresponding to the power consumption values is not generated.

Figure 14:
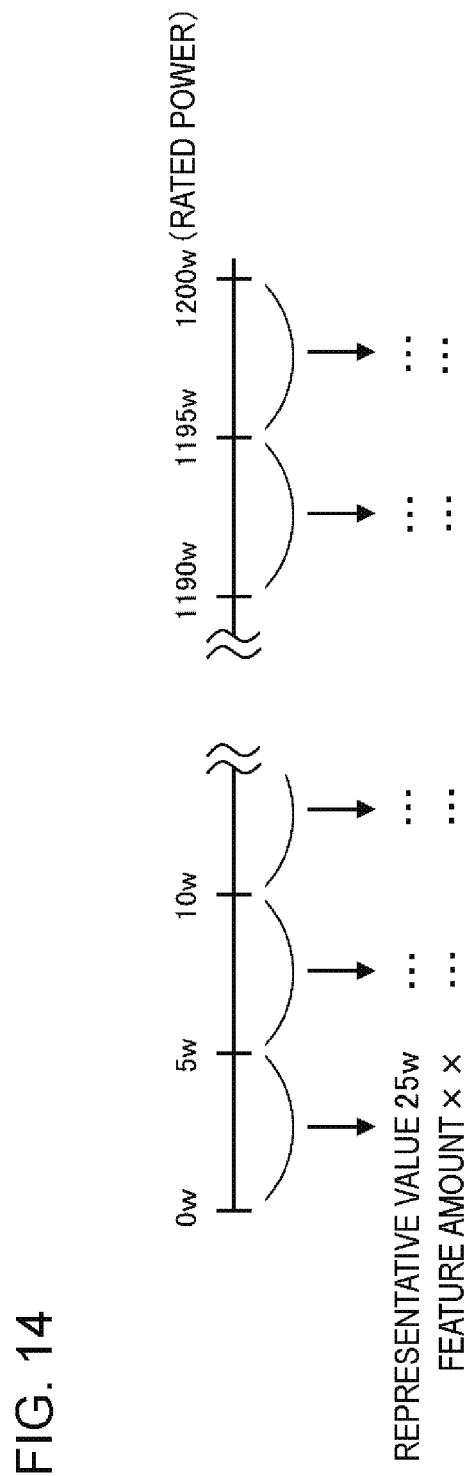
FIG. 14 is a diagram illustrating a method of generating the training data in the comparison example.

According to the present exemplary embodiment, it is possible to reduce the number of pieces of training data of the electrical device in comparison with an example in which groups (units in which representative power values and feature amounts are determined) are set so that power consumption value bands (greater than 0 W and equal to or less than the rated power) actually consumable by the electrical devices are all covered, as in the example illustrated in FIG. 14, and the representative power value and feature amount are determined for each group. Consequently, the number of pieces of sum training data can be reduced in comparison with the foregoing example. The number of pieces of training data is reduced, but training data corresponding to the power consumption value with a high rate of occurrence is generated. Therefore, precision in a process of inferring an operation state of a monitoring electrical device through a collation process using the training data (including sum training data) can be maintained equally to the foregoing example.

Figure 3:
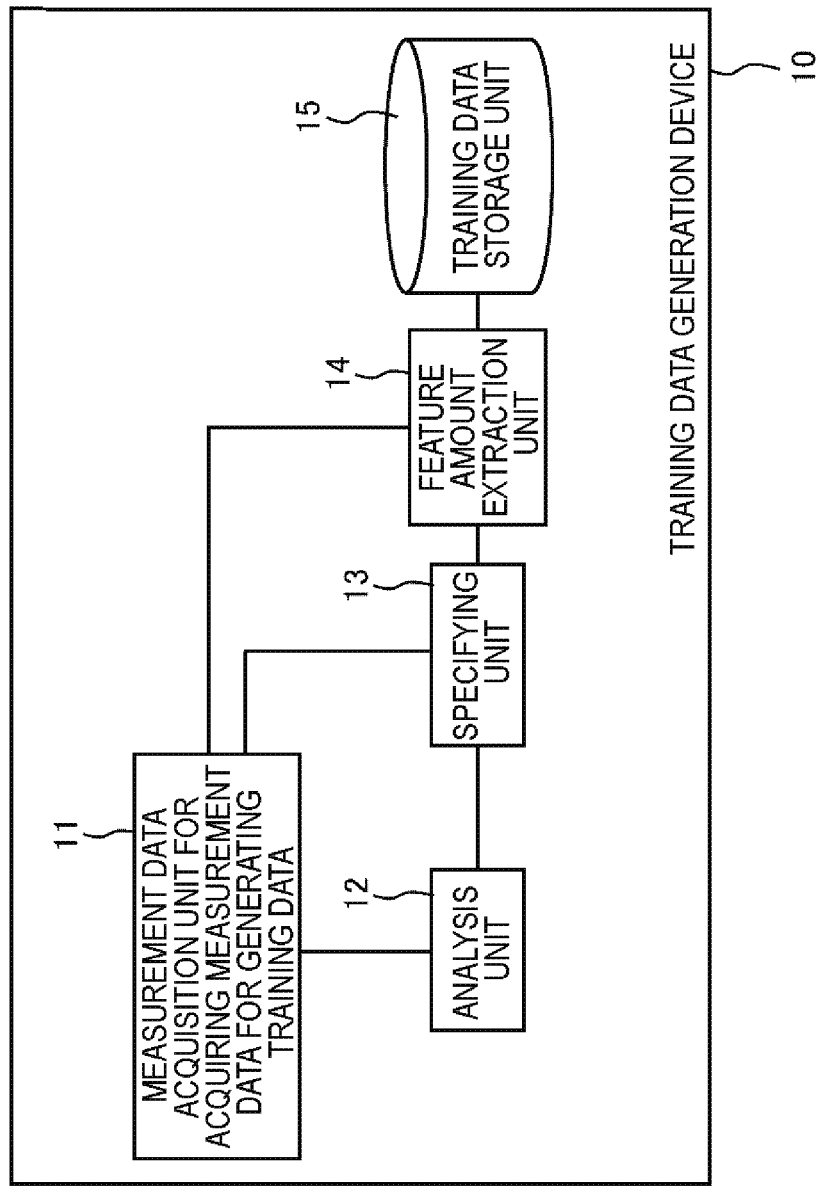
FIG. 3 is a diagram illustrating an example of a functional block diagram illustrating the training data generation device according to the present exemplary embodiment.

Next, a configuration according to the present exemplary embodiment will be described in detail. FIG. 3 illustrates an example of a functional block diagram of a training data generation device 10 according to the present exemplary embodiment. As illustrated, the training data generation device 10 includes a measurement data acquisition unit 11 for acquiring measurement data for generating training data (corresponding to a "measurement data acquisition unit" in CLAIMS), an analysis unit 12, a specifying unit 13, a feature amount extraction unit 14, and a training data storage unit 15 (corresponding to a "storage unit" in CLAIMS).

The measurement data acquisition unit 11 for acquiring measurement data for generating training data acquires measurement data for generating training data (corresponding to "measurement data" in CLAIMS). The measurement data for generating training data includes waveform data for generating training data (corresponding to "waveform data" in CLAIMS) and power consumption value data for generating training data (corresponding to "power consumption value data" in CLAIMS).

The waveform data for generating training data includes at least one of a current consumption waveform, an input voltage waveform, and a power consumption waveform along a time axis of a processing target electrical device which is a target of a process of generating the training data. The power consumption value data for generating training data indicates time-series power consumption values of the processing target electrical device (that is, data in which power consumption values of the processing target electrical device are temporally consecutive for each predetermined time). The waveform data for generating training data and the power consumption value data for generating training data are pieces of data measured from the processing target electrical device at the same timing (the same time period). The measurement data for generating training data is data for each electrical device.

The measurement data for generating training data is configured to specify a timing, at which each of the power consumption values included in the power consumption value data for generating training data is measured, in waveform data for generating training data.

For example, time information, elapsed-time information from a measurement start timing, or the like is associated with the waveform data for generating training data and the power consumption value data for generating training data. The waveform data for generating training data may be divided into a plurality of pieces of sub-waveform data segmented from a series of waveform data in units of a predetermined length. Further, each piece of sub-waveform data (the waveform data for generating training data) and each power consumption value (the power consumption value data for generating training data) may be associated. A method of extracting the plurality of pieces of sub-waveform data from the series of waveform data is not particularly limited. The plurality of pieces of sub-waveform data may be extracted by shifting the sub-waveform data with a length T (for example, a length corresponding to a predetermined period) by t (greater than 0 and equal to or less than T). In the case of t<T, the pieces of adjacent sub-waveform data partially have a mutually common portion.

The measurement data for generating training data is preferably data measured by operating a processing target electrical device in all of the possible operation modes of the electrical device. The measurement data for generating training data is preferably data measured by continuing an operation in each operation mode for a predetermined time or more (for example, 30 seconds or more, 1 minute or more, or 5 minutes or more).

The analysis unit 12 analyzes the rate of occurrence of each consumption power value using the power consumption value data for generating training data. As an analysis method, for example, a method of generating a frequency distribution curve and analyzing the frequency distribution curve, a method of generating a histogram and analyzing the histogram, or a method of dividing a power consumption value band (greater than 0 W and equal or less than the rated power) actually consumable by the processing target electrical device into a plurality of groups and counting the number of occurrences of the consumption power values in each group is considered. However, the present invention is not limited thereto.

Figure 4:
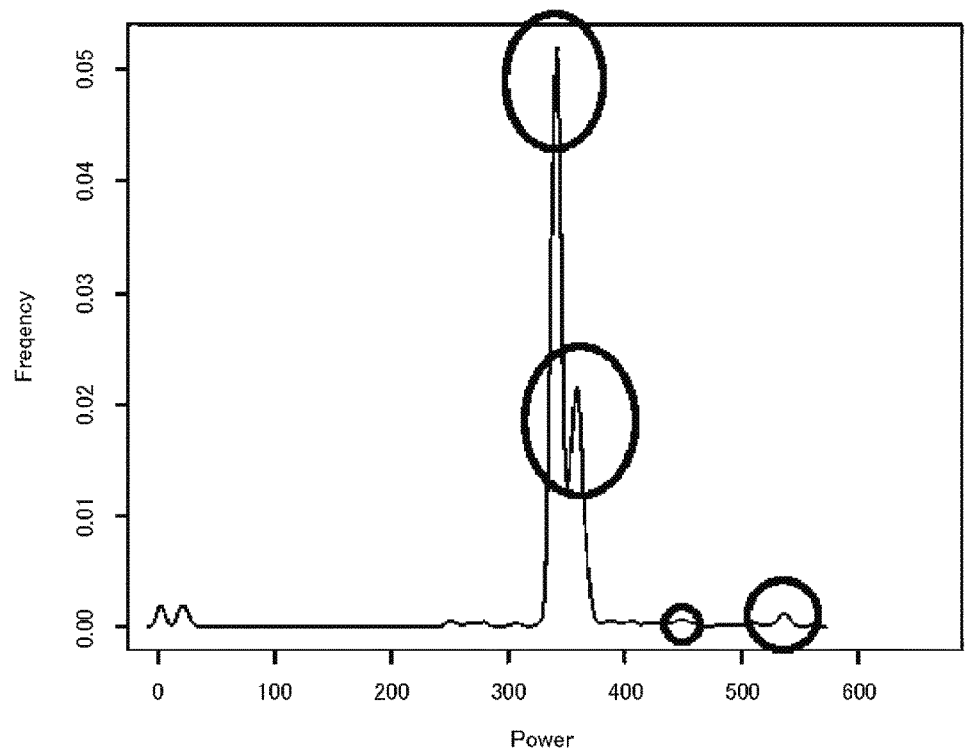
FIG. 4 is a diagram illustrating an example of processes of an analysis unit and a specifying unit 13 according to the present exemplary embodiment.

The generation of the frequency distribution curve may be achieved, for example, by performing kernel density inference. In this case, for example, a Gaussian kernel can be used in a kernel function and the band width of Silverman can be used in a band width. Another kernel function (for example, a polynomial) or another band width can also be used. FIG. 4 illustrates an example of the frequency distribution curve generated by the analysis unit 12. The horizontal axis represents power consumption value and the vertical axis represents the rate of occurrence.

The specifying unit 13 specifies one or more specific power consumption value bands which include power consumption values having a rate of occurrence higher than that of a standard power consumption value and having a predetermined power value width. The specific power consumption value band corresponds to the above-described group (the unit in which the representative power value and the feature amount are determined).

The standard power consumption value may be, for example, "power consumption value of target+$\alpha$ (design factor)" and "power consumption value of target−$\alpha$". In this case, the standard power consumption value of a power consumption value (the power consumption value of the target) of 150 W is (150+$\alpha$) W and (150−$\alpha$) W. When it is determined whether the rate of occurrence of the power consumption value (the power consumption value of the target) of 150 W is greater than that of the standard power consumption value, the rate of occurrence of the power consumption value (the power consumption value of the target) of 150 W is compared to the rate of occurrence of the power consumption value (150+$\alpha$) W and the rate of occurrence of the power consumption value (150−$\alpha$) W.

When $\alpha$ is appropriately set, the specifying unit 13 can specify one or more power consumption values which are maximum values in a graph (for example, a frequency distribution curve or a histogram) in which the horizontal axis represents the power consumption value and the vertical axis represents the rate of occurrence and can specify one or more specific power consumption value bands including the specified power consumption values, respectively.

The specifying unit 13 may specify one or more specific power consumption value bands so that the power consumption values with the higher rate of occurrence than that of the standard power consumption value are all included or may specify one or more specific power consumption value bands so that the power consumption values with the higher rate of occurrence than that of the standard power consumption value are partially included.

For example, the specifying unit 13 may specify one or more power consumption values which are maximum values in the graph in which the horizontal axis represents the power consumption value and the vertical axis represents the rate of occurrence, as described above, and then extract a predetermined M number of maximum values in order from the highest rate of occurrence among the plurality of specified maximum values. The specifying unit 13 may specify the predetermined M number of specific power consumption value bands so that the predetermined M number of respective extracted maximum values (power consumption values) are included in the specific power consumption value bands. The specifying unit 13 may also extract only the maximum values which are values equal to or greater than a predetermined ratio (for example, 0.9% or more) of the largest value N of the maximum values.

The specifying unit 13 may remove a low power consumption value band, and then perform a process of specifying the specific power consumption value bands. That is, the low power consumption value band may be excluded from a target for which the specific power consumption value band is specified. A threshold value used for the removal can be set in each electrical device. For example, a band of equal to or less than 10% of the value of the rated power may be set as the low power consumption value band.

The specifying unit 13 can specify a power consumption value P with a higher rate of occurrence than that of the standard power consumption value, and then specify, for example, a range of equal to or greater than (P−β) and equal to or less than (P+β) as one specific power consumption value band. The value of β is a design factor.

In the case of the example illustrated in FIG. 4, the specifying unit 13 specifies four specific power consumption value bands so that four maximum values (peaks) encircled by circles are included four in the specific power consumption value bands.

The feature amount extraction unit 14 determines the representative power value using the power consumption values included in the specific power consumption value band for each power consumption value band specified by the specifying unit 13. The feature amount extraction unit 14 extracts the feature amount (training feature amount) using the waveform data for generating training data at the timing at which the power consumption value included in the specific power consumption value band is measured (for example, the waveform data corresponding to the predetermined wavelength including the timing), for each specific power consumption value band specified by the specifying unit 13. For example, the feature amount extraction unit 14 extracts the feature amount (training feature amount) using the plurality of pieces of sub-waveform data for which the associated power consumption values are included in the specific power consumption value band (using any of the plurality of pieces of sub-waveform data or using the waveform data obtained by averaging the plurality of pieces of sub-waveform data).

The representative power value can be set as, for example, a statistical value (an average value, a maximum value, a minimum value, a median value, the power consumption value with the highest rate of occurrence, or the like) calculated based on the power consumption values included in the specific power consumption value band.

The training feature amount is a feature amount which can be specified using at least one of a current consumption waveform, an input voltage waveform, and a power consumption waveform and may be, for example, a frequency intensity phase (harmonic component) of current consumption, a phase, a change in current consumption, an average value, a peak value, an effective value, a peak factor, a form factor, a convergence time of a current change, an energization time, the position of a peak, a time difference between a peak position of a voltage and a peak position of current consumption, or a power factor. The training feature amount is not limited to the examples herein. The feature amount extraction unit 14 extracts such a feature amount using the waveform data for generating training data corresponding to some or all of the power consumption values included in the specific power consumption value band (for which a measurement timing is identical). A process of extracting the feature amount can be achieved in conformity to a technology of the related art.

The training data storage unit 15 stores a pair of the representative power value determined based on each of the specific power consumption value band and the feature amount (the training feature amount) in association therewith.

FIG. 5 schematically illustrates an example of information stored in the training data storage unit 15. The information illustrated in FIG. 5 is training data regarding a certain dryer. The illustrated power value band indicates the specific power consumption value band specified by the specifying unit 13. The illustrated representative value and feature amount indicate the representative power value and the feature amount (the training feature amount) determined for each specific power consumption value band by the feature amount extraction unit 14.

FIG. 2 is a diagram illustrating a concept of a process of generating the training data illustrated in FIG. 5. Referring to the drawing, it can be ascertain that the specific power consumption value bands (groups) are partially set in a range of greater than 0 W and equal to or less than 1200 W which is a power consumption value band consumable by the dryer, and the representative power value and the feature amount (the training feature amount) are determined for each specific power consumption value band (group).

In this way, in the case of the present exemplary embodiment, one or more specific power consumption value bands (the power value bands in FIG. 5) specified by the specifying unit 13 do not include parts of the consumable power consumption value bands by a processing target electrical device. That is, one or more specific power consumption value bands (the power value bands in FIG. 5) specified by the specifying unit 13 may not necessarily cover all of the consumable power consumption value bands by the processing target electrical device and do not include some of the power consumption value bands. The consumable power consumption value band by the processing target electrical device is the power value band of greater than 0 W and equal to or less than the value of the rated power of the processing target electrical device.

FIG. 6 schematically illustrates another example of the information stored in the training data storage unit 15. The information illustrated in FIG. 6 is the training data regarding a plurality of electrical devices. An illustrated electrical device ID indicates identification information of each electrical device. An illustrated training ID indicates identification information (corresponding to the ID illustrated in FIG. 5) assigned for each specific power consumption value band specified by the specifying unit 13 in correspondence to the electrical device. An illustrated representative value and feature amount indicate the representative power value and the feature amount (the training feature amount) determined for each specific power consumption value band by the feature amount extraction unit 14.

The feature amount extraction unit 14 may generate a sum training feature amount by adding the feature amounts (the training feature amounts) extracted for each electrical device. The sum training data may be stored in the training data storage unit 15.

The sum training feature amount corresponding to each of all the combinations of a plurality of monitoring electrical devices. Each combination can be divided into a plurality of combinations according to the plurality of representative values (power consumption) associated with the monitoring electrical devices. For example, a combination of first monitoring electrical device and second monitoring electrical device is considered. For simplicity, it is assumed that two representative values of power consumption of 2.5 W and 5 W are associated with the first monitoring electrical device and three representative values of 1 W, 2 W, and 3 W are associated with the second monitoring electrical device. In this case, the combination (first: second) of the first and second monitoring electrical devices are divided into 6 combinations, (2.5 W: 1 W), (2.5 W: 2 W), (2.5 W: 3 W), (5 W: 1 W), (5 W: 2 W), and (5 W: 3 W). The electrical devices corresponding to the summed feature amount (the training feature amount) and the power consumption value (the representative power value) of each electrical device are associated with the sum training feature amount.

Figure 7:
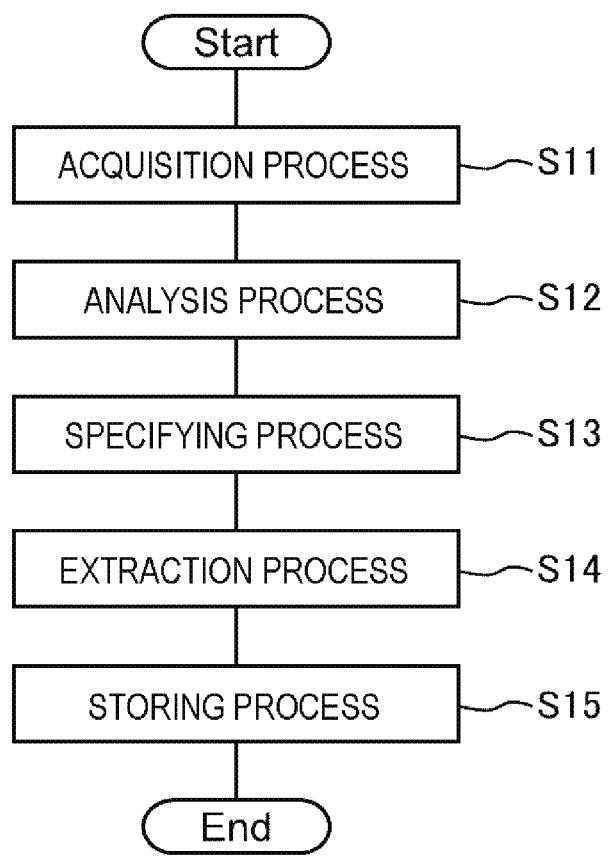
FIG. 7 is a flowchart illustrating an example of the flow of a process of the training data generation device according to the present exemplary embodiment.

Next, an example of the flow of a process of the training data generation device 10 according to the present exemplary embodiment will be described with reference to the flowchart of FIG. 7.

First, the measurement data acquisition unit 11 for acquiring measurement data for generating training data acquires the measurement data for generating training data which includes the waveform data for generating training data including at least one of the current consumption waveform, the input voltage waveform, and the power consumption waveform along the time axis of the processing target electrical device which is the target of the process of generating the training data and the power consumption value data for generating training data indicating the time-series power consumption values of the processing target electrical device and in which the measurement timing of each power consumption value included in the power consumption value data for generating training data can be specified in the waveform data for generating training data (acquisition process S11).

Thereafter, the analysis unit 12 analyzes the rate of occurrence of each power consumption value using the power consumption value data for generating training data (analysis process S12).

Therefore, the specifying unit 13 specifies one or more specific power consumption value bands including the power consumption value with a higher rate of occurrence than that of the standard power consumption value and having a predetermined power value width (specifying process S13).

Thereafter, the feature amount extraction unit 14 determines the representative power value using the power consumption value included in the specific power consumption value band for each specific power consumption value band and extracts the feature amount (the training feature amount) using the waveform data for generating training data of a timing at which the power consumption value included in the specific power consumption value band is measured (extraction process S14).

Thereafter, the pair of representative power value and feature amount (training feature amount) determined based on the specific power consumption value band is associated with the processing target electrical device to be stored in the training data storage unit 15 (storing process S15).

According to the above-described present exemplary embodiment, a new technology for generating the training data used to specify an operation state of an electrical device is realized.

In the present exemplary embodiment, as in the example illustrated in FIG. 14, the groups (units in which representative power values and feature amounts are determined) are not set so that the power consumption value bands (greater than 0 W and equal to or less than the rated power) actually consumable by the electrical devices are all covered and the representative power value and the feature amount (training feature amount) are not generated for each group. As illustrated in FIG. 2, groups (units in which representative power values and feature amounts are determined) are partially set so that the power consumption values (the power consumption values with the high rate of occurrence in the power consumption value data for generating training data) frequently consumed by the electrical devices are included, and the representative power value and the feature amount (training feature amount) are generated for each group.

Therefore, it is possible to reduce the number of pieces of training data of the electrical devices in comparison with the example illustrated in FIG. 14. As a result, it is possible to also reduce the number of pieces of sum training data in comparison with the example illustrated in FIG. 14. The number of pieces of training data is reduced, but training data corresponding to the power consumption values with a high rate of occurrence is generated. Therefore, precision of a process of inferring an operation state of a monitoring electrical device through a collation process using the training data (including sum training data) can be maintained equally to the foregoing example illustrated in FIG. 14.

<Second Exemplary Embodiment>

A training data generation device 10 according to a present exemplary embodiment further has a function of specifying an operation state of a monitoring electrical device using the training data generated in the configuration described in the first exemplary embodiment.

Figure 8:
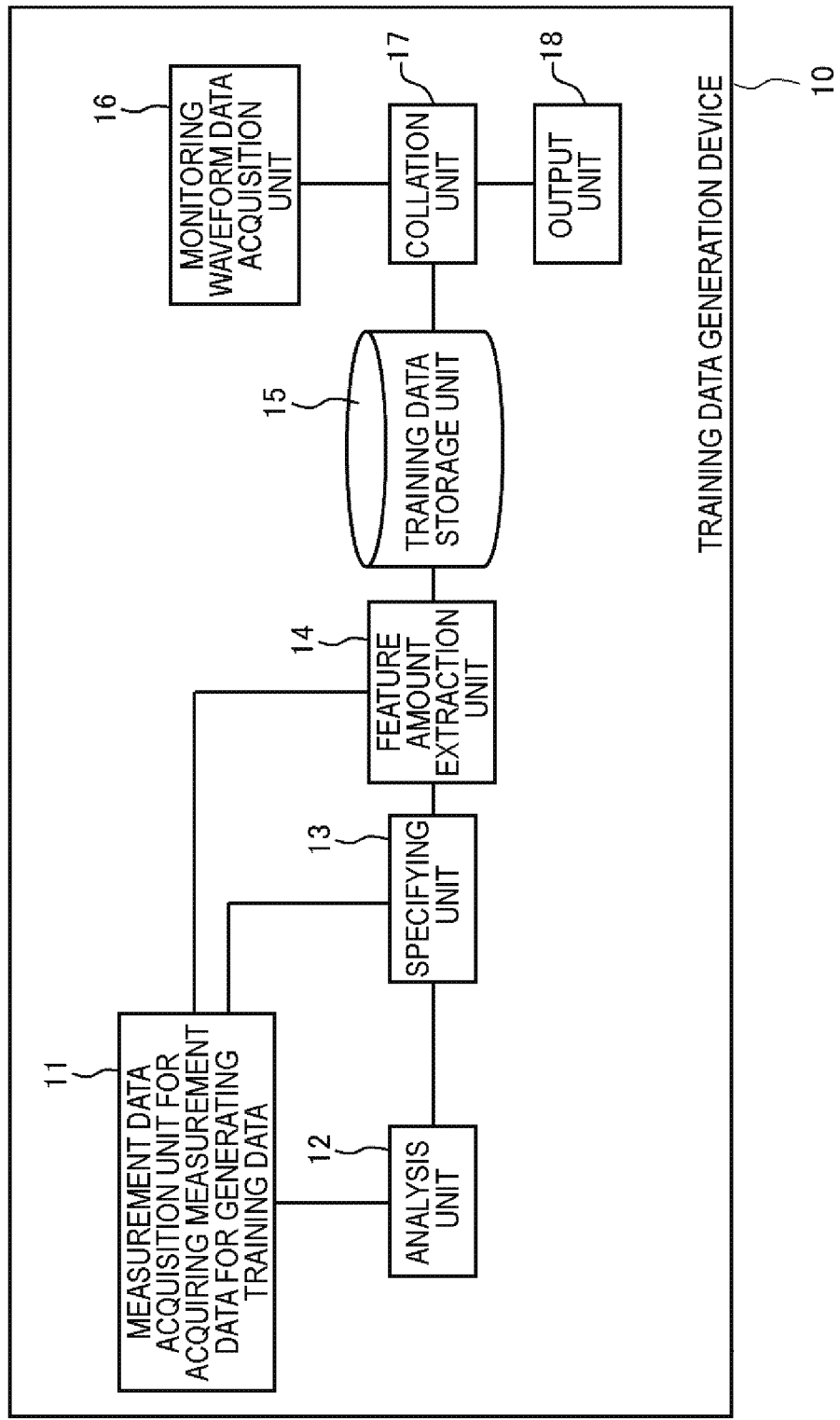
FIG. 8 is a diagram illustrating an example of a functional block diagram of the training data generation device according to the present exemplary embodiment.

FIG. 8 illustrates an example of a functional block diagram of the training data generation device 10 according to the present exemplary embodiment. As illustrated, the training data generation device 10 includes a measurement data acquisition unit 11 for acquiring measurement data for generating training data, an analysis unit 12, a specifying unit 13, a feature amount extraction unit 14, a training data storage unit 15, a monitoring waveform data acquisition unit 16, a collation unit 17, and an output unit 18.

The configurations of the measurement data acquisition unit 11 for acquiring measurement data for generating training data, the analysis unit 12, the specifying unit 13, the feature amount extraction unit 14, and the training data storage unit 15 are the same as those of the first exemplary embodiment. The training data storage unit 15 stores training data (including sum training data) regarding a plurality of monitoring electrical devices in advance.

The monitoring waveform data acquisition unit 16 acquires monitoring waveform data including at least one of a current consumption waveform, an input voltage waveform, and a power consumption waveform along a time axis of the monitoring electrical device.

Specifically, the monitoring waveform data acquisition unit 16 acquires monitoring waveform data measured by a measuring instrument installed near a power trunk line portion such as a power-feeding service entrance or a distribution board. The monitoring waveform data is configured to include only the waveform data of one monitoring electrical device according to an operation state of each of the plurality of monitoring electrical devices in some cases, and the monitoring waveform data is also configured to include waveform data obtained by adding the waveform data of the plurality of monitoring electrical devices in other cases.

The monitoring waveform data acquisition unit 16 may acquire the monitoring waveform data from the measuring instrument through a real-time process or may collectively acquire the monitoring waveform data corresponding to a constant time (for example, 1 hour or 1 day) from the measuring instrument through a batch process. In a case in which a current operation state of the monitoring electrical device is reported to the user in real time, the real-time process is selected. On the other hand, in a case in which the operation state of the monitoring electrical device within a constant period is collectively reported to the user at a certain timing, the real-time process or the batch process is selected.

The collation unit 17 performs a collation process using the monitoring feature amount which is the feature amount extracted from the monitoring waveform data and the training feature amount (including the sum training feature amount) of the monitoring electrical device stored in the training data storage unit 15. For example, the collation unit 17 obtains the training feature amount (including the sum training feature amount) matching the monitoring feature amount as an inference result (collation result) by inputting the monitoring feature amount into an inference model generated using the teach feature amount (including the sum training feature amount) of the monitoring electrical device stored in the training data storage unit 15. In the inference model, for example, multiple regression analysis, a neural network, or a genetic algorithm can be used. The monitoring feature amount can be set as the same kind of feature amount as the training feature amount. The collation unit 17 can select the real-time process and the batch process according to a manner of reporting to the user.

As a result of the collation process by the collation unit 17, the output unit 18 outputs the representative power value associated with the training feature amount (including the sum training feature amount) matching the monitoring feature amount as a power consumption value of the monitoring electrical device at that time. FIG. 9 illustrates an output example of the output unit 18. In the illustrated example, a total power consumption value (instantaneous value) and power consumption values (instantaneous values) of electrical devices such as an air-conditioner, a dryer, and a refrigerator at 14:03 Feb. 19, 2014 are illustrated.

In a case in which the training feature amount (including the sum training feature amount) matching the monitoring feature amount is not found, the output unit 18 may output information indicating there is a possibility of a defect such as breakdown of any monitoring electrical device occurring. In the case in which the training feature amount (including the sum training feature amount) matching the monitoring feature amount is not found, it is considered that the state of the monitoring electrical device is changed (broken down, or the like) and waveform data different from the waveform data at the normal time is generated. The feature amount of the monitoring electrical device of which the state is different from the normal state is not generated. Therefore, in a case in which the feature amount of the monitoring electrical device is included in the monitoring feature amount, the monitoring feature amount does not match the training feature amount (including the sum training feature amount).

In the case of the present exemplary embodiment, the training data is generated to partially cover the range of greater than 0 W and equal to or less than the rated power which is a consumable power consumption value band by each electrical device. Therefore, when a portion of that is not covered by the training data is consumed by the electrical device, the case in which the training feature amount (including the sum training feature amount) matching the monitoring feature amount is not found occurs. In order to avoid the problem that the information indicating a possibility of the defect occurring is output in such a state, information indicating that there is a possibility of a defect such as breakdown occurring in any monitoring electrical device may be output when a frequency at which the training feature amount (including the sum training feature amount) matching the monitoring feature amount is not found is equal to or greater than a predetermined level (for example, 50 times or more in 15 minutes).

The processes of specifying the operation state of the monitoring electrical device by the monitoring waveform data acquisition unit 16, the collation unit 17, and the output unit 18 according to the present exemplary embodiment are characteristic in the configuration of the training data (the training feature amount) used in the processes, and all of the configuration conforming to the technology of the related art can be adopted for details of the other remaining processes.

Figure 10:
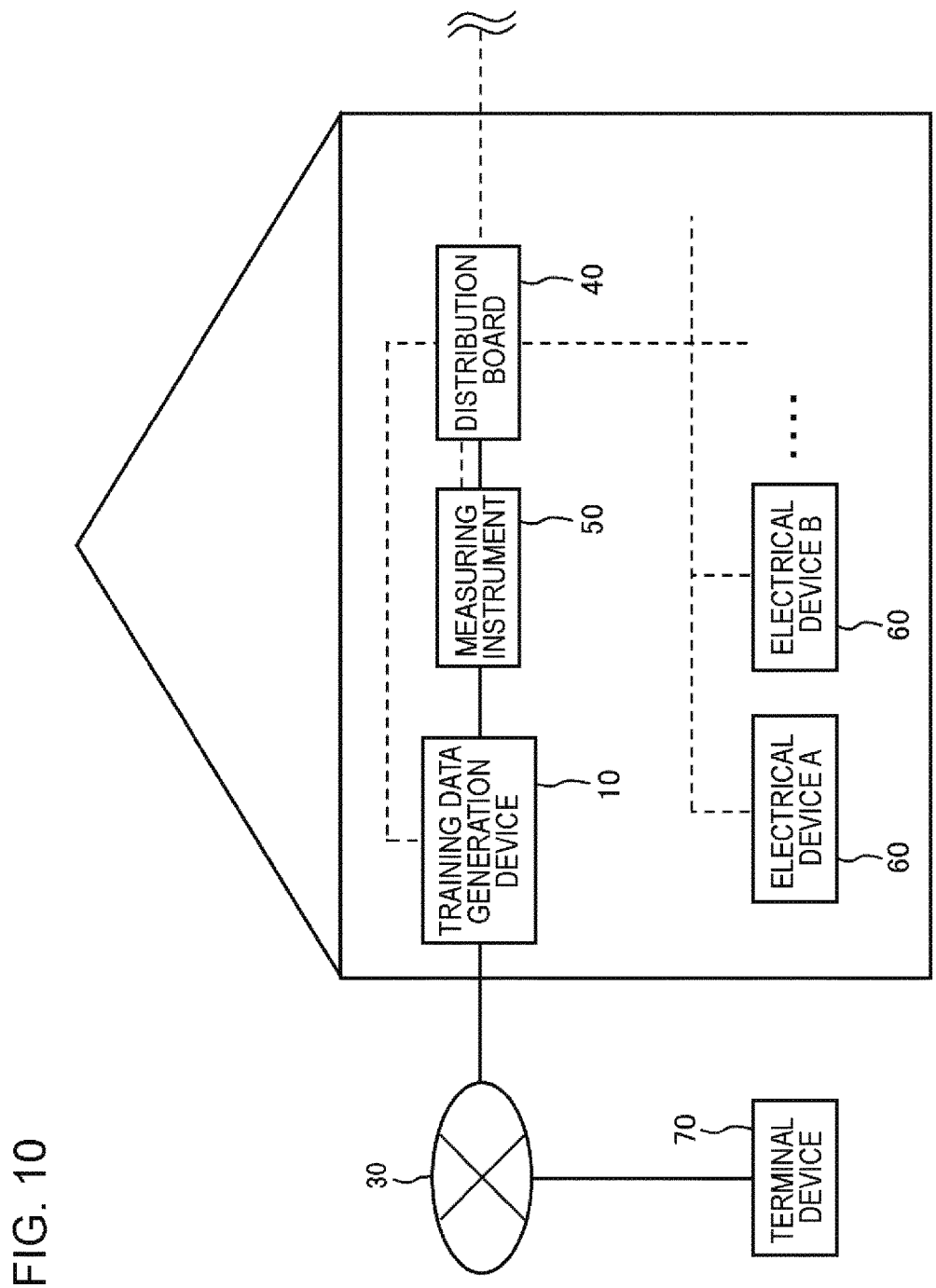
FIG. 10 is a diagram illustrating an example of an application example of the training data generation device according to the present exemplary embodiment.

FIG. 10 illustrates an application example of the training data generation device 10 according to the present exemplary embodiment. In the application example, the training data generation device 10 is installed in a predetermined unit (a household, a company, one floor of a building, or the like). In the predetermined unit, a plurality of electrical devices 60 are installed. Power is supplied to each electrical device 60 through a distribution board 40 installed in the unit. In the drawing, the flow of the power is indicated by a dotted line. The flow of data is indicated by a solid line.

A measuring instrument 50 is installed beside the distribution board 40 to measure current consumption, an input voltage, power consumption, and the like. Measurement data measured by the measuring instrument 50 is transmitted to the training data generation device 10. The training data generation device 10, the distribution board 40, and the measuring instrument 50 are in a state in which data communication is possible through a LAN or a dedicated cable linking the plurality of devices. The training data generation device 10 is connected to a terminal device 70 owned by a user through a network 30 such as the Internet. The electrical device 60 and the training data generation device 10 may be in the state in which data communication with each other is possible although not connected by a data communication line in the drawing. For example, the electrical device 60 may have a function of being connected to a network such as a LAN.

In the case of the application example, for example, after the training data generation device 10 is installed in the predetermined unit, the electrical devices 60 are individually operated. The training data generation device 10 receives an input of information identifying the operated electrical devices 60 from, for example, the user and acquires measurement data measured by the measuring instrument 50 at that time as the measurement data for generating training data corresponding to the electrical devices 60. Thereafter, as described in the first exemplary embodiment, the training data generation device 10 generates the training data corresponding to each electrical device 60 and stores the training data in the training data storage unit 15.

As another example, the measurement data for generating training data of each of various diverse electrical devices available in markets may be stored in a server (not illustrated) connected to the network 30. The training data generation device 10 acquires information identifying each of the electrical devices 60 installed in the predetermined unit through an input by manually operating the training data generation device 10, an input through the terminal device 70, or communication with each of the electrical devices 60. Thereafter, the measurement data acquisition unit 11 for acquiring measurement data for generating training data of the training data generation device 10 may access the server and acquire the measurement data for generating training data of each of the identified electrical devices 60. Thereafter, as described in the first exemplary embodiment, the training data generation device 10 generates the training data corresponding to each electrical device 60 and stores the training data in the training data storage unit 15.

The foregoing two examples may be combined as an example. That is, when the training data generation device 10 acquires the information identifying each of the electrical devices 60 installed in the predetermined unit, the training data generation device 10 accesses the server and acquires the measurement data for generating training data of each of the identified electrical devices 60. At this time, in a case in which the measurement data for generating training data of one or more electrical devices 60 may not be acquired due to a reason such as non-preservation in the server, the training data generation device 10 may output information prompting action of individually operating the electrical devices 60 for which the measurement data for generating training data may not be acquired, to the user. Then, the training data generation device 10 may generate the training data using the measurement data for generating training data acquired from the server and the measurement data for generating training data acquired from the measuring instrument 50.

After the training data is generated in this way, the training data generation device 10 acquires the monitoring waveform data from the measuring instrument 50 and specifies the operation states of the monitoring electrical devices 60, as described in the present exemplary embodiment. Then, the output unit 18 of the training data generation device 10 transmits the information (see FIG. 9) indicating the power consumption values of the monitoring electrical devices to the terminal device 70 or outputs the information to a display included in the training data generation device 10.

Figure 17:
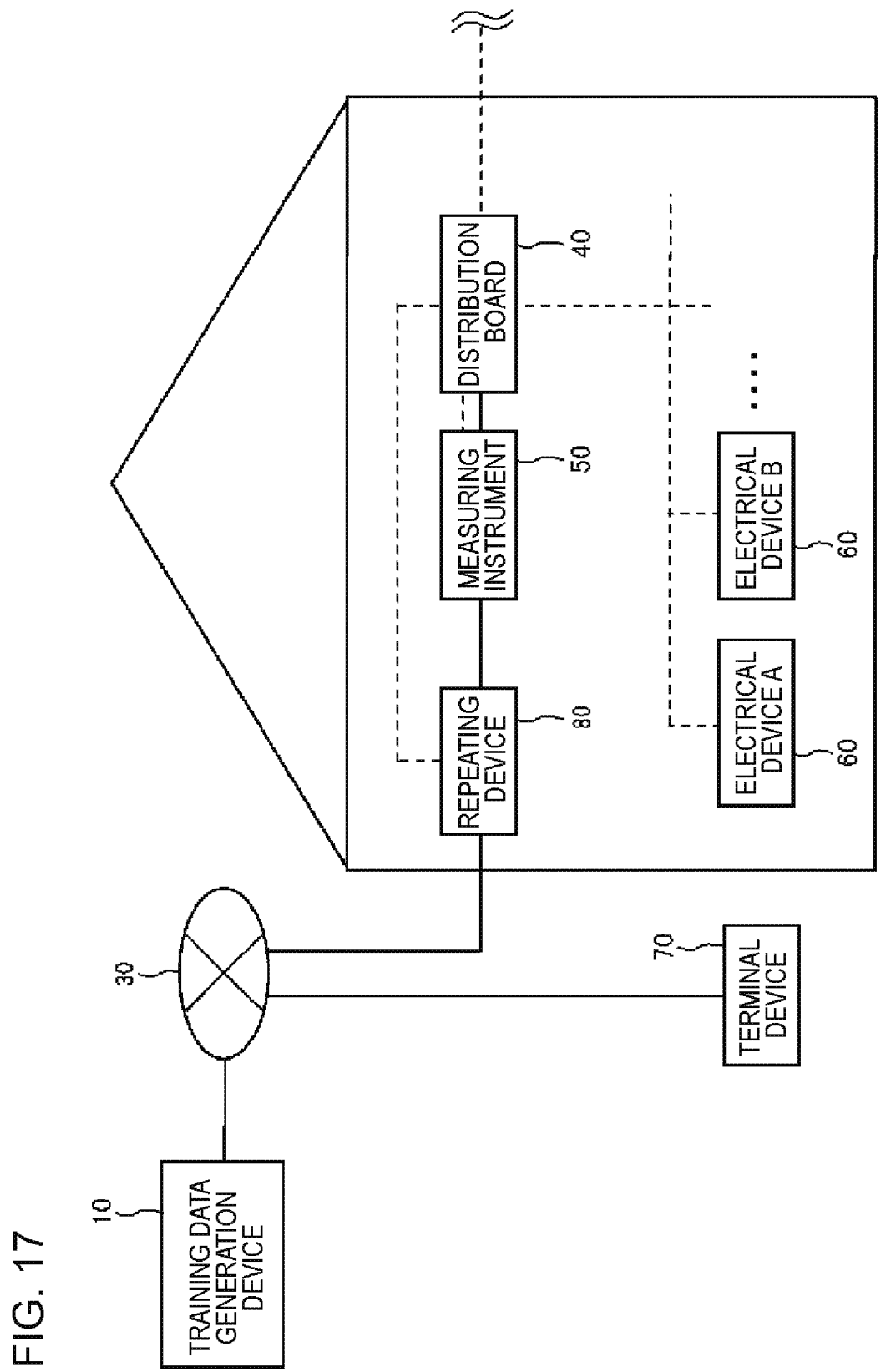
FIG. 17 is a diagram illustrating an example of an application example of the training data generation device according to the present exemplary embodiment.

FIG. 17 illustrates another application example. In the application example, the training data generation device 10 is installed outside the predetermined unit. The training data generation device 10 may be a so-called cloud server. The training data generation device 10 is connected to a network 30 to be able to perform data communication with a repeating device 80 or the terminal device 70.

The repeating device 80 is installed in the predetermined unit. When the repeating device 80 acquires the measurement data (the measurement data for generating training data, the monitoring waveform data, or the like) from the measuring instrument 50, the repeating device 80 transmits the acquired measurement data to the training data generation device 10. As in the example illustrated in FIG. 10, for example, the repeating device 80 can receive an input of information identifying the electrical device 60 corresponding to each piece of measurement data for generating training data from the user and can transmit identification information regarding the electrical device 60 corresponding each piece of measurement data for generating training data to the training data generation device 10 along with the measurement data for generating training data. When the repeating device 80 acquires data (information or the like identifying the electrical device 60 installed in the unit) from the electrical devices 60 installed in the predetermined unit, the repeating device 80 transmits the acquired data to the training data generation device 10. When the repeating device 80 receives an input of predetermined information (information or the like identifying the electrical device 60 installed in the unit) from the user, the repeating device 80 transmits the acquired information to the training data generation device 10.

The training data generation device 10 generates the training data (including the sum training data) or specifies the operation states of the electrical devices 60 using the data transmitted from the repeating device 80.

According to the above-described present exemplary embodiment, it is possible to realize the same operational effects as those of the first exemplary embodiment. The process of specifying the operation states of the monitoring electrical devices is performed using the characteristic training data described in the first exemplary embodiment. Therefore, it is possible to improve a processing speed while equally maintaining the precision of the process of inferring the operation states of the monitoring electrical devices in comparison with the case in which the training data generated as in the example illustrated in FIG. 14 is used.

<Third Exemplary Embodiment>

Figure 11:
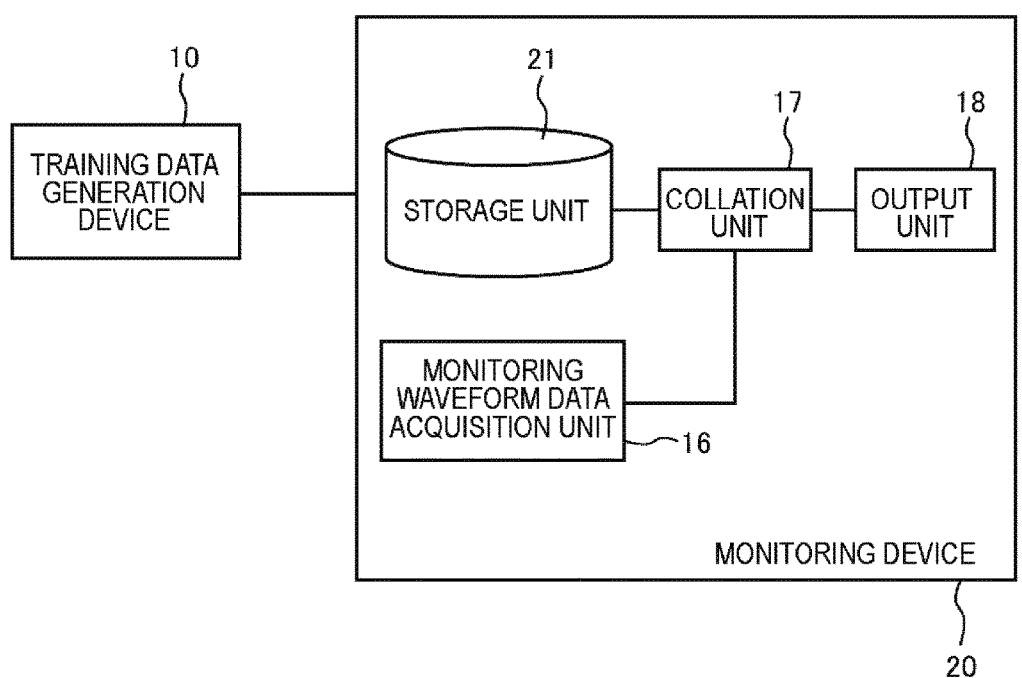
FIG. 11 is a diagram illustrating an example of a functional block diagram of a monitoring device 20 according to the present exemplary embodiment.

FIG. 11 illustrates an example of a functional block diagram of an electrical device monitoring system according to a present exemplary embodiment. As illustrated, the electrical device monitoring system according to the present exemplary embodiment includes the training data generation device 10 and a monitoring device 20. An example of a functional block diagram of the training data generation device 10 is illustrated in, for example, FIG. 3. The configuration of the training data generation device 10 according to the present exemplary embodiment is the same as that of the first exemplary embodiment.

The monitoring device 20 includes a storage unit 21, a monitoring waveform data acquisition unit 16, a collation unit 17, and an output unit 18. The storage unit 21 stores the training data (including the sum training data) regarding electrical devices installed in a predetermined unit (a household, a company, one floor of a building, or the like) in which the monitoring device 20 is installed. The configuration of the monitoring waveform data acquisition unit 16, the collation unit 17, and the output unit 18 are the same those of the second exemplary embodiment. The collation unit 17 performs a collation process using the training data (including the sum training data) stored in the storage unit 21.

Figure 12:
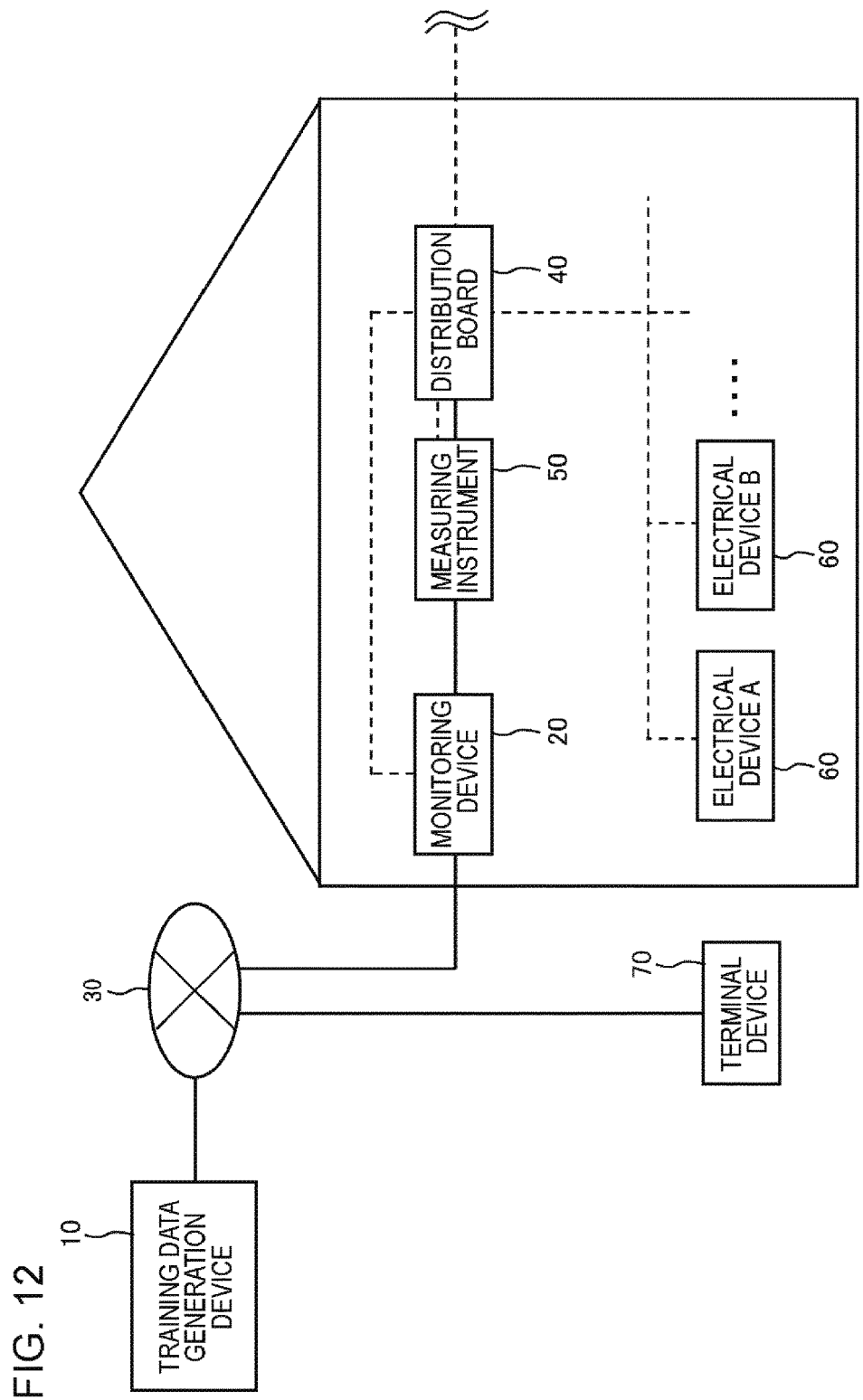
FIG. 12 is a diagram illustrating an example of an application example of an electrical device monitoring system according to the present exemplary embodiment.

FIG. 12 illustrates an application example of the training data generation device 10 according to the present exemplary embodiment. In the application example, the monitoring device 20 is installed in the predetermined unit (a household, a company, one floor of a building, or the like). In the predetermined unit, a plurality of electrical devices 60 are installed. Power is supplied to each electrical device 60 through a distribution board 40 installed in the unit. In the drawing, the flow of the power is indicated by a dotted line. The flow of data is indicated by a solid line.

A measuring instrument 50 is installed beside the distribution board 40 to measure current consumption, an input voltage, power consumption, and the like. Measurement data measured by the measuring instrument 50 is transmitted to the monitoring device 20. The monitoring device 20, the distribution board 40, and the measuring instrument 50 are in a state in which data communication is possible through a LAN or a dedicated cable linking the plurality of devices. The monitoring device 20 is connected to a terminal device 70 owned by a user through a network 30 such as the Internet. The electrical device 60 and the monitoring device 20 may be in the state in which data communication with each other is possible although not connected by a data communication line in the drawing. For example, the electrical device 60 may have a function of being connected to a network such as a LAN.

The training data generation device 10 is installed outside the predetermined unit. The training data generation device 10 may be a so-called cloud server. The training data generation device 10 is connected to a network 30 to be able to perform data communication with the monitoring device 20 or the terminal device 70.

In the case of the application example, for example, the training data generation device 10 generates and stores training data of each of various diverse electrical devices available in markets in advance. After the monitoring device 20 is installed in the predetermined unit, the monitoring device 20 acquires information identifying each of the electrical devices 60 installed in the predetermined unit through an input by manually operating the monitoring device 20, an input through the terminal device 70, or communication with each of the electrical devices 60. Thereafter, the monitoring device 20 accesses the training data generation device 10 and requests the training data (including the sum training data) of the identified electrical devices 60.

Then, the training data generation device 10 extracts the training data corresponding to each of the identified electrical devices 60 and generates the sum training data in which the extracted training data are combined. The training data generation device 10 transmits the extracted training data and the generated sum training data to the monitoring device 20 as a response. The monitoring device 20 stores the received training data (including the sum training data) in the storage unit 21.

As another example, after the monitoring device 20 is installed in the predetermined unit, the electrical devices 60 are individually operated. At this time, the monitoring device 20 acquires the measurement data measured by the measuring instrument 50 and transmits the measurement data to the training data generation device 10. Then, the training data generation device 10 generates the training data (including the sum training data) using the acquired measurement data (the measurement data for generating training data) and transmits the training data to the monitoring device 20 as a response. The monitoring device 20 stores the received training data (including the sum training data) in the storage unit 21.

As still another example, for example, the training data generation device 10 stores the measurement data for generating training data of each of various diverse electrical devices available in markets in advance. After the monitoring device 20 is installed in the predetermined unit, the monitoring device 20 acquires information identifying each of the electrical devices 60 installed in the predetermined unit through an input by manually operating the monitoring device 20, an input through the terminal device 70, or communication with each of the electrical devices 60. Thereafter, the monitoring device 20 accesses the training data generation device 10 and request the training data (including the sum training data) of the identified electrical devices 60.

Then, the training data generation device 10 extracts the measurement data for generating training data corresponding to each of the identified electrical devices 60 and generates the training data (including the sum training data) using the extracted measurement data for generating training data. The training data generation device 10 transmits the generated training data (including the sum training data) to the monitoring device 20 as a response. The monitoring device 20 stores the received training data (including the sum training data) in the storage unit 21.

As still another example, the foregoing examples may be combined as an example. After the monitoring device 20 is installed in the predetermined unit, the monitoring device 20 acquires information identifying each of the electrical devices 60 installed in the predetermined unit through an input by manually operating the monitoring device 20, an input through the terminal device 70, or communication with each of the electrical devices 60. Thereafter, the monitoring device 20 accesses the training data generation device 10 and requests the training data (including the sum training data) of the identified electrical devices 60.

Then, the training data generation device 10 generates the training data (including the sum training data) to respond to the monitoring device 20 using the training data or the measurement data for generating training data of each of the plurality of electrical devices stored in advance. At this time, in a case in which there is no data (the training data or the measurement data for generating training data) corresponding to one or more electrical devices 60, the training data generation device 10 requests the measurement data of the electrical devices 60 from the monitoring device 20. Then, the monitoring device 20 outputs information prompting action of individually operating the electrical devices 60 to the user. The monitoring device 20 acquires the measurement data (the measurement data for generating training data) of the electrical devices 60 from the measuring instrument 50 and transmits the measurement data to the training data generation device 10 as a response.

Thereafter, the training data generation device 10 generates the training data (including the sum training data) of the electrical devices 60 installed in the predetermined unit using the data (the training data or the measurement data for generating training data) stored in advance and the measurement data for generating training data received from the monitoring device 20. The training data generation device 10 transmits the generated training data (including the sum training data) to the monitoring device 20 as a response. The monitoring device 20 stores the received training data (including the sum training data) in the storage unit 21.

After the training data (the sum training data) is stored in the storage unit 21 of the monitoring device 20 in this way, the monitoring device 20 specifies the operation states of the monitoring electrical devices 60, as described in the second exemplary embodiment and the present exemplary embodiment. Then, the output unit 18 of the monitoring device 20 transmits the information (see FIG. 9) indicating the power consumption values of the monitoring electrical devices to the terminal device 70 or outputs the information to a display included in the monitoring device 20.

According to the above-described present exemplary embodiment, it is possible to realize the same operational effects as those of the first and second exemplary embodiments. The process of specifying the operation states of the monitoring electrical devices is performed using the characteristic training data described in the first exemplary embodiment. Therefore, it is possible to improve a processing speed while equally maintaining the precision of the process of inferring the operation states of the monitoring electrical devices in comparison with the case in which the training data generated as in the example illustrated in FIG. 14 is used.

Here, examples of services realized based on results inferred by the training data generation device 10 and the monitoring device 20 according to the second and third exemplary embodiments will be described.

For example, it is possible to give advice for power saving. In the training data generation device 10 and the monitoring device 20 according to the second and third exemplary embodiments, it is possible to ascertain a temporal change of the operation states of the electrical devices in a day (from 00:00 to 24:00). Based on such an output, it is possible to specify a time period in which the electrical devices are used in a large amount and provide advice of intentionally reducing the use of the electrical devices during the time period.

As another example, it is possible to give a notification of a timing of maintenance of an electrical device (for example, cleaning of an air-conditioner). In the training data generation device 10 and the monitoring device 20 according to the second and third exemplary embodiments, it is possible to calculate an accumulated operation time of each electrical device by accumulating inference results. For example, it is possible to give a notification for prompting maintenance at a timing at which an accumulative time becomes a predetermined value. A consumed current, a consumed power, a voltage, a measurement feature amount, and the like may change due to breakdown of an electrical device or deterioration of some components over time. Accordingly, for example, it is possible to give a notification for prompting maintenance when such change is detected.

As still another example, it is possible to give advice on use of a refrigerator. According to a loading state inside the refrigerator, a consumed current, a consumed power, a voltage, a measurement feature amount, and the like may change. In the training data generation device 10 and the monitoring device 20 according to second and third exemplary embodiments, such change can be detected. Based on the change, a warning against overstuffing or a prompt for increasing storage due to a decrease in storage can be notified of.

As still another example, in the training data generation device 10 and the monitoring device 20 according to the second and third exemplary embodiments, in comparison to a history of previous inference results, it is possible to detect whether a use pattern of electrical devices is different from at the normal time. In a case in which the user pattern of the electrical devices is different from the use pattern at the normal time, there is a possibility of a certain change (for example, service receivers are sick or involved in incidents) occurring in service receivers (users of the electronic devices). Accordingly, in such a case, a contact destination registered in advance can be notified of the warning.

As still another example, in the training data generation device 10 and the monitoring device 20 according to the second and third exemplary embodiments, a life rhythm or the like of a user can be inferred based on a use pattern of electronic devices (for example, a use pattern in a day). Accordingly, a warning of improving the life rhythm can be given to a user of an irregular life rhythm (for example, activities are considerable in the night (use of many electronic devices in the night) and day activities and night activities irregularly occur).

EXAMPLES

A case (Example 1) in which the training data (including the sum training data) is generated by the method (see FIG. 2) described in the first exemplary embodiment was compared to a case (Comparative Example 1) in which the training data (including the sum training data) is generated by the method of the example illustrated in FIG. 14.
<Generation of Training Data of Each Electrical Device>
"Kitchen Illuminator (High)"
Example 1
After a power frequency distribution curve was generated, from the power consumption values which were maximum values in a graph in which the horizontal axis represents the power consumption value and the vertical axis represents the rate of occurrence, one power consumption value was extracted in order from the highest rate of occurrence. Thereafter, a power consumption value band of ±5 W of the extracted power consumption power value was specified as a specific power consumption value band. An average of the power consumption values included in the specific power consumption value band was set as a representative value, and a harmonic component was extracted as a feature amount from a current consumption waveform at a timing at which the power consumption value was measured.
Comparative Example 1
An average of the power consumption values included in from 0 W to a rated power value was set as a representative value, and a harmonic component was extracted as a feature amount from a current consumption waveform at a timing at which the power consumption value was measured.
"Bathroom Illuminator"
Example 1
After a power frequency distribution curve was generated, from the power consumption values which were maximum values in a graph in which the horizontal axis represents the power consumption value and the vertical axis represents the rate of occurrence, one power consumption value was extracted in order from the highest rate of occurrence. Thereafter, a power consumption value band of ±5 W of the extracted power consumption power value was specified as a specific power consumption value band. An average of the power consumption values included in the specific power consumption value band was set as a representative value, and a harmonic component was extracted as a feature amount from a current consumption waveform at a timing at which the power consumption value was measured.
Comparative Example 1
An average of the power consumption values included in from 0 W to a rated power value was set as a representative value, and a harmonic component was extracted as a feature amount from a current consumption waveform at a timing at which the power consumption value was measured.
"Kitchen Illuminator (Low)"
Example 1
After a power frequency distribution curve was generated, from the power consumption values which were maximum values in a graph in which the horizontal axis represents the power consumption value and the vertical axis represents the rate of occurrence, one power consumption value was extracted in order from the highest rate of occurrence. Thereafter, a power consumption value band of ±5 W of the extracted power consumption power value was specified as a specific power consumption value band. An average of the power consumption values included in the specific power consumption value band was set as a representative value, and a harmonic component was extracted as a feature amount from a current consumption waveform at a timing at which the power consumption value was measured.
Comparative Example 1
A range from 0 W to the rated power value is equally divided into two groups. An average of the power consumption values included in each group was set as a representative value, and a harmonic component was extracted as a feature amount from a current consumption waveform at a timing at which the power consumption value was measured.
"Electrical Pot"
Example 1
After a power frequency distribution curve was generated, from the power consumption values which were maximum values in a graph in which the horizontal axis represents the power consumption value and the vertical axis represents the rate of occurrence, one power consumption value was extracted in order from the highest rate of occurrence. Thereafter, a power consumption value band of ±5 W of the extracted power consumption power value was specified as a specific power consumption value band. An average of the power consumption values included in the specific power consumption value band was set as a representative value, and a harmonic component was extracted as a feature amount from a current consumption waveform at a timing at which the power consumption value was measured.

Comparative Example 1

An average of the power consumption values included in from 0 W to a rated power value was set as a representative value, and a harmonic component was extracted as a feature amount from a current consumption waveform at a timing at which the power consumption value was measured.

"Kitchen Ventilation Fan"

Example 1

After a power frequency distribution curve was generated, from the power consumption values which were maximum values in a graph in which the horizontal axis represents the power consumption value and the vertical axis represents the rate of occurrence, one power consumption value was extracted in order from the highest rate of occurrence. Thereafter, a power consumption value band of ±5 W of the extracted power consumption power value was specified as a specific power consumption value band. An average of the power consumption values included in the specific power consumption value band was set as a representative value, and a harmonic component was extracted as a feature amount from a current consumption waveform at a timing at which the power consumption value was measured.

Comparative Example 1

An average of the power consumption values included in from 0 W to a rated power value was set as a representative value, and a harmonic component was extracted as a feature amount from a current consumption waveform at a timing at which the power consumption value was measured.

"Kitchen Heater"

Example 1

After a power frequency distribution curve was generated, from the power consumption values which were maximum values in a graph in which the horizontal axis represents the power consumption value and the vertical axis represents the rate of occurrence, one power consumption value was extracted in order from the highest rate of occurrence. Thereafter, a power consumption value band of ±5 W of the extracted power consumption power value was specified as a specific power consumption value band. An average of the power consumption values included in the specific power consumption value band was set as a representative value, and odd-order harmonic components of equal to or less than the 13th order were extracted as a feature amount from a current consumption waveform at a timing at which the power consumption values were measured.

Comparative Example 1

An average of the power consumption values included in from 0 W to a rated power value was set as a representative value, and a harmonic component was extracted as a feature amount from a current consumption waveform at a timing at which the power consumption value was measured.

"Electrical Fan"

Example 1

After a power frequency distribution curve was generated, from the power consumption values which were maximum values in a graph in which the horizontal axis represents the power consumption value and the vertical axis represents the rate of occurrence, one power consumption value was extracted in order from the highest rate of occurrence. Thereafter, a power consumption value band of ±5 W of the extracted power consumption power value was specified as a specific power consumption value band. An average of the power consumption values included in the specific power consumption value band was set as a representative value, and a harmonic component was extracted as a feature amount from a current consumption waveform at a timing at which the power consumption value was measured.

Comparative Example 1

An average of the power consumption values included in from 0 W to a rated power value was set as a representative value, and a harmonic component was extracted as a feature amount from a current consumption waveform at a timing at which the power consumption value was measured.

"Dryer"

Example 1

After a power frequency distribution curve was generated, from the power consumption values which were maximum values in a graph in which the horizontal axis represents the power consumption value and the vertical axis represents the rate of occurrence, two power consumption values were extracted in order from the highest rate of occurrence. Thereafter, a power consumption value band of ±5 W of the extracted power consumption power value was specified as a specific power consumption value band. An average of the power consumption values included in each specific power consumption value band was set as a representative value, and a harmonic component was extracted as a feature amount from a current consumption waveform at a timing at which the power consumption value was measured.

Comparative Example 1

A range from 0 W to the rated power value is equally divided into three groups. An average of the power consumption values included in each group was set as a representative value, and a harmonic component was extracted from a current consumption waveform at a timing at which the power consumption value was measured.

"Room Illuminator (LED)"

Example 1

After a power frequency distribution curve was generated, from the power consumption values which were maximum values in a graph in which the horizontal axis represents the power consumption value and the vertical axis represents the rate of occurrence, one power consumption value was extracted in order from the highest rate of occurrence. Thereafter, a power consumption value band of ±5 W of the extracted power consumption power value was specified as a specific power consumption value band. An average of the power consumption values included in the specific power consumption value band was set as a representative value, and a harmonic component was extracted as a feature amount from a current consumption waveform at a timing at which the power consumption value was measured.

Comparative Example 1

A range from 0 W to the rated power value is equally divided into two groups. An average of the power consumption values included in each group was set as a representative value, and a harmonic component was extracted as a feature amount from a current consumption waveform at a timing at which the power consumption value was measured.

"Microwave"

Example 1

After a power frequency distribution curve was generated, from the power consumption values which were maximum values in a graph in which the horizontal axis represents the power consumption value and the vertical axis represents the rate of occurrence, one power consumption value was extracted in order from the highest rate of occurrence. Thereafter, a power consumption value band of ±5 W of the extracted power consumption power value was specified as a specific power consumption value band. An average of the power consumption values included in the specific power consumption value band was set as a representative value, and a harmonic component was extracted as a feature amount from a current consumption waveform at a timing at which the power consumption value was measured.

Comparative Example 1

An average of the power consumption values included in from 0 W to a rated power value was set as a representative value, and a harmonic component was extracted from a current consumption waveform at a timing at which the power consumption value was measured.

"Refrigerator"

Example 1

After a power frequency distribution curve was generated, from the power consumption values which were maximum values in a graph in which the horizontal axis represents the power consumption value and the vertical axis represents the rate of occurrence, one power consumption value was extracted in order from the highest rate of occurrence. Thereafter, a power consumption value band of ±5 W of the extracted power consumption power value was specified as a specific power consumption value band. An average of the power consumption values included in the specific power consumption value band was set as a representative value, and a harmonic component was extracted as a feature amount from a current consumption waveform at a timing at which the power consumption value was measured.

Comparative Example 1

An average of the power consumption values included in from 0 W to a rated power value was set as a representative value, and a harmonic component was extracted as a feature amount from a current consumption waveform at a timing at which the power consumption value was measured.

"PC Monitor"

Example 1

After a power frequency distribution curve was generated, from the power consumption values which were maximum values in a graph in which the horizontal axis represents the power consumption value and the vertical axis represents the rate of occurrence, one power consumption value was extracted in order from the highest rate of occurrence. Thereafter, a power consumption value band of ±5 W of the extracted power consumption power value was specified as a specific power consumption value band. An average of the power consumption values included in the specific power consumption value band was set as a representative value, and a harmonic component was extracted as a feature amount from a current consumption waveform at a timing at which the power consumption value was measured.

Comparative Example 1

An average of the power consumption values included in from 0 W to a rated power value was set as a representative value, and a harmonic component was extracted as a feature amount from a current consumption waveform at a timing at which the power consumption value was measured.

"Air-Conditioner"

Example 1

After a power frequency distribution curve was generated, from the power consumption values which were maximum values in a graph in which the horizontal axis represents the power consumption value and the vertical axis represents the rate of occurrence, four power consumption values were extracted in order from the highest rate of occurrence. Thereafter, a power consumption value band of ±5 W of the extracted power consumption power value was specified as a specific power consumption value band. An average of the power consumption values included in each specific power consumption value band was set as a representative value, and a harmonic component was extracted as a feature amount from a current consumption waveform at a timing at which the power consumption value was measured.

Comparative Example 1

A range from 0 W to the rated power value is equally divided into five groups. An average of the power consumption values included in each group was set as a representative value, and a harmonic component was extracted as a feature amount from a current consumption waveform at a timing at which the power consumption values was measured.

"Room Illuminator"

Example 1

After a power frequency distribution curve was generated, from the power consumption values which were maximum values in a graph in which the horizontal axis represents the power consumption value and the vertical axis represents the rate of occurrence, two power consumption values were extracted in order from the highest rate of occurrence. Thereafter, a power consumption value band of ±5 W of the extracted power consumption power value was specified as a specific power consumption value band. An average of the power consumption values included in each specific power consumption value band was set as a representative value, and a harmonic component was extracted as a feature amount from a current consumption waveform at a timing at which the power consumption value was measured.

Comparative Example 1

A range from 0 W to the rated power value is equally divided into two groups. An average of the power consumption values included in each group was set as a representative value, and a harmonic component was extracted as a feature amount from a current consumption waveform at a timing at which the power consumption value was measured.

"Television"

Example 1

After a power frequency distribution curve was generated, from the power consumption values which were maximum values in a graph in which the horizontal axis represents the power consumption value and the vertical axis represents the rate of occurrence, one power consumption value was extracted in order from the highest rate of occurrence. Thereafter, a power consumption value band of ±5 W of the extracted power consumption power value was specified as a specific power consumption value band. An average of the power consumption values included in the specific power consumption value band was set as a representative value, and a harmonic component was extracted as a feature amount from a current consumption waveform at a timing at which the power consumption value was measured.

Comparative Example 1

A range from 0 W to the rated power value is equally divided into two groups. An average of the power consumption values included in each group was set as a representative value, and a harmonic component was extracted as a feature amount from a current consumption waveform at a timing at which the power consumption value was measured.

<Generation of Sum Training Data>

Example 1

The sum training data was generated by adding the pieces of training data of the foregoing 15 kinds of electrical devices in all combinations.

Comparative Example 1

The sum training data was generated by adding the pieces of training data of the foregoing 15 kinds of electrical devices in all combinations.

<Process of Specifying Operation of Electrical Device>

Current consumption waveforms were measured in a distribution board supplying power to the foregoing 15 kinds of electrical devices. The operation states of the electrical devices were specified by collating the feature amounts extracted from the measured current consumption waveforms with the training data (including the sum training data) of Example 1 and the training data (including the sum training data) of Comparative Example 1. The operation states of the electrical devices are changed at random.

Inference errors of the power consumption value of each electrical device were calculated with a relative error index (MAPE). The results are shown in Tables 1 to 4. As apparent from the description of the method of generating the training data, the number of pieces of training data in Example 1 is less than the number of pieces of training data in Comparative Example 1. However, as shown in Tables 1 to 4, the inference errors in Example 1 are substantially the same as the inference errors in Comparative Example 1.

TABLE 1

|  | Kitchen Illuminator (High) | Bathroom Illuminator | Kitchen Illuminator (Low) | Electrical Pot |
|---|---|---|---|---|
| Comparative Example 1 | 0.22 | 0.27 | 0.37 | 0.44 |
| Example 1 | 0.18 | 0.23 | 0.34 | 0.4 |

TABLE 2

|  | Kitchen Ventilation Fan | Kitchen Heater | Electrical Fan | Dryer |
|---|---|---|---|---|
| Comparative Example 1 | 0.38 | 0.77 | 0.84 | 1.59 |
| Example 1 | 0.4 | 0.57 | 0.87 | 1.07 |

TABLE 3

|  | Room Illuminator (LED) | Microwave | Refrigerator | PC Monitor |
|---|---|---|---|---|
| Comparative Example 1 | 0.99 | 1.57 | 1.83 | 2.66 |
| Example 1 | 1.12 | 1.15 | 2.13 | 2.27 |

TABLE 4

|  | Air-conditioner | Room Illuminator | Television |
|---|---|---|---|
| Comparative Example 1 | 3.71 | 3.79 | 2.65 |
| Example 1 | 2.3 | 3.84 | 4 |

Hereinafter, examples of reference configurations will be appended.

1. A training data generation device including:

a measurement data acquisition unit that acquires measurement data including waveform data including at least one of a current consumption waveform, an input voltage waveform, and a power consumption waveform along a time axis of an electrical device which is a target of a process of generating training data and power consumption value data indicating time-series power consumption values of the electrical device;

an analysis unit that analyzes a rate of occurrence of each power consumption value using the power consumption value data;

a specifying unit that specifies one or more specific power consumption value bands including a power consumption value with the higher rate of occurrence than that of a standard power consumption value and having a predetermined power value width;

a feature amount extraction unit that determines a representative power value and extracts a feature amount using the waveform data for each specific power consumption value band; and a storage unit that stores a pair of the representative power value determined based on each specific power consumption value band and a training feature amount which is the feature amount in association with the electrical device.

2. The training data generation device described in 1, wherein in the measurement data, a measurement timing of each power consumption value included in the power consumption value data is able to be specified in the waveform data.

3. The training data generation device described in 1 or 2, wherein the feature amount extraction unit determines the representative power value based on the power consumption value included in the specific power consumption value band and extracts the feature amount using the waveform data at the measurement timing of the power consumption value included in the specific power consumption value band for each specific power consumption value band.

4. The training data generation device described in any one of 1 to 3, wherein the specifying unit specifies one or more power consumption values which are maximum values in a graph in which a horizontal axis represents the power consumption value and a vertical axis represents the rate of occurrence and specifies one or more specific power consumption value bands including each specified power consumption value.

5. The training data generation device described in any one of 1 to 4, wherein the one or more specific power consumption value bands specified by the specifying unit do not include some of the power consumption value bands consumable by the electrical device.

6. The training data generation device described in 5, wherein the power consumption value bands consumable by the electrical device are the power value bands of greater than 0 W and equal to or less than a value of rated power of the electrical device.

7. The training data generation device described in any one of 1 to 6, further including:

a monitoring waveform data acquisition unit that acquires monitoring waveform data including at least one of the current consumption waveform, the input voltage waveform, and the power consumption waveform along the time axis of the electrical device which is a monitoring target;

a collation unit that performs a collation process using a monitoring feature amount which is a feature amount extracted from the monitoring waveform data and the training feature amount of the electrical device stored in the storage unit; and an output unit that outputs the representative power value associated with the training feature amount matching the monitoring feature amount as the power consumption value of the electrical device.

8. An electrical device monitoring system including:
the training data generation device described in any one of 1 to 6; and
a monitoring device that infers an operation state of each monitoring electrical device which is a monitoring target using the training feature amount of the electrical device generated by the training data generation device,
wherein the monitoring device includes
a monitoring waveform data acquisition unit that acquires monitoring waveform data including at least one of a current consumption waveform, an input voltage waveform, and a power consumption waveform of the electrical device,
a collation unit that performs a collation process using a monitoring feature amount which is a feature amount extracted from the monitoring waveform data and the training feature amount of the electrical device generated by the training data generation device, and
an output unit that outputs the representative power value associated with the training feature amount matching the monitoring feature amount as the power consumption value of the electrical device.

9. A program causing a computer to function as:
a measurement data acquisition unit that acquires measurement data including waveform data including at least one of a current consumption waveform, an input voltage waveform, and a power consumption waveform along a time axis of an electrical device which is a target of a process of generating training data and power consumption value data indicating time-series power consumption values of the electrical device;
an analysis unit that analyzes a rate of occurrence of each power consumption value using the power consumption value data;
a specifying unit that specifies one or more specific power consumption value bands including a power consumption value with the higher rate of occurrence than that of a standard power consumption value and having a predetermined power value width;
a feature amount extraction unit that determines a representative power value and extracts a feature amount using the waveform data for each specific power consumption value band; and
a storage unit that stores a pair of the representative power value determined based on each specific power consumption value band and a training feature amount which is the feature amount in association with the electrical device.

9-2. The program described in 9,
wherein in the measurement data, a measurement timing of each power consumption value included in the power consumption value data is able to be specified in the waveform data.

9-3. The program described in 9 or 9-2,
wherein the feature amount extraction unit is caused to determine the representative power value based on the power consumption value included in the specific power consumption value band and is caused to extract the feature amount using the waveform data at the measurement timing of the power consumption value included in the specific power consumption value band for each specific power consumption value band.

9-4. The program described in any one of 9 to 9-3,
wherein the specifying unit is caused to specify one or more power consumption values which are maximum values in a graph in which a horizontal axis represents the power consumption value and a vertical axis represents the rate of occurrence and is caused to specify one or more specific power consumption value bands including each specified power consumption value.

9-5. The program described in any one of 9 to 9-4,
wherein the one or more specific power consumption value bands specified by the specifying unit do not include some of the power consumption value bands consumable by the electrical device.

9-6. The program described in 9-5,
wherein the power consumption value band consumable by the electrical device is the power value band of greater than 0 W and equal to or less than a value of rated power of the electrical device.

9-7. The program described in any one of 9 to 9-6, the program causing the computer to function as:
a monitoring waveform data acquisition unit that acquires monitoring waveform data including at least one of the current consumption waveform, the input voltage waveform, and the power consumption waveform along the time axis of the electrical device which is a monitoring target;
a collation unit that performs a collation process using a monitoring feature amount which is a feature amount extracted from the monitoring waveform data and the training feature amount of the electrical device stored in the storage unit; and
an output unit that outputs the representative power value associated with the training feature amount matching the monitoring feature amount as the power consumption value of the electrical device.

10. A training data generation method performed by a computer, the method including:
a measurement data acquisition step of acquiring measurement data including waveform data including at least one of a current consumption waveform, an input voltage waveform, and a power consumption waveform along a time axis of an electrical device which is a target of a process of generating training data and power consumption value data indicating time-series power consumption values of the electrical device;
an analysis step of analyzing a rate of occurrence of each power consumption value using the power consumption value data;
a specifying step of specifying one or more specific power consumption value bands including a power consumption value with the higher rate of occurrence than that of a standard power consumption value and having a predetermined power value width;
a feature amount extraction step of deciding a representative power value and extracting a feature amount using the waveform data for each specific power consumption value band; and
a storage step of storing a pair of the representative power value determined based on each specific power consumption value band and a training feature amount which is the feature amount in association with the electrical device in a storage device.

10-2. The training data generation method described in 10,
wherein in the measurement data, a measurement timing of each power consumption value included in the power consumption value data is able to be specified in the waveform data.

10-3. The training data generation method described in 10 or 10-2,
wherein in the feature amount extraction step, the representative power value is determined based on the power consumption value included in the specific power consumption value band and the feature amount is extracted using the waveform data at the measurement timing of the power consumption value included in the specific power consumption value band for each specific power consumption value band.

10-4. The training data generation method described in any one of 10 to 10-3,
wherein in the specifying step, one or more power consumption values which are maximum values in a graph, in which a horizontal axis represents the power consumption value and a vertical axis represents the rate of occurrence, is specified and one or more specific power consumption value bands including each specified power consumption value is specified.

10-5. The training data generation method described in any one of 10 to 10-4,
wherein the one or more specific power consumption value bands specified in the specifying step do not include some of the power consumption value bands consumable by the electrical device.

10-6. The training data generation method described in 10-5,
wherein the power consumption value bands consumable by the electrical device are the power value bands of greater than 0 W and equal to or less than a value of rated power of the electrical device.

10-7. The training data generation method described in any one of 10 to 10-6, the method performed by a computer, the method including:
a monitoring waveform data acquisition step of acquiring monitoring waveform data including at least one of the current consumption waveform, the input voltage waveform, and the power consumption waveform along the time axis of the electrical device which is a monitoring target;
a collation step of performing a collation process using a monitoring feature amount which is a feature amount extracted from the monitoring waveform data and the training feature amount of the electrical device stored in the storage device; and
an output step of outputting the representative power value associated with the training feature amount matching the monitoring feature amount as the power consumption value of the electrical device.

This application claims priority from Japanese Patent Application No. 2014-071120 filed on Mar. 31, 2014, the content of which is incorporated herein by reference in its entirety.

The invention claimed is:

1. A training data generation device comprising:
a measurement data acquisition unit that acquires measurement data including waveform data including at least one of a current consumption waveform, an input voltage waveform, and a power consumption waveform along a time axis of an electrical device which is a target of a process of generating training data and power consumption value data indicating time-series power consumption values of the electrical device;
an analysis unit that analyzes a rate of occurrence of each power consumption value using the power consumption value data;
a specifying unit that specifies one or more specific power consumption value bands including a power consumption value with the higher rate of occurrence than that of a standard power consumption value and having a predetermined power value width;
a feature amount extraction unit that determines a representative power value and extracts a feature amount using the waveform data for each specific power consumption value band; and
a storage unit that stores a pair of the representative power value determined based on each specific power consumption value band and a training feature amount which is the feature amount in association with the electrical device.

2. The training data generation device according to claim 1,
wherein in the measurement data, a measurement timing of each power consumption value included in the power consumption value data is able to be specified in the waveform data.

3. The training data generation device according to claim 1,
wherein the feature amount extraction unit determines the representative power value based on the power consumption value included in the specific power consumption value band and extracts the feature amount using the waveform data at the measurement timing of the power consumption value included in the specific power consumption value band for each specific power consumption value band.

4. The training data generation device according to claim 1,
wherein the specifying unit specifies one or more power consumption values which are maximum values in a graph in which a horizontal axis represents the power consumption value and a vertical axis represents the rate of occurrence and specifies one or more specific power consumption value bands including each specified power consumption value.

5. The training data generation device according to claim 1,
wherein the one or more specific power consumption value bands specified by the specifying unit do not include some of the power consumption value bands consumable by the electrical device.

6. The training data generation device according to claim 5,
wherein the power consumption value band consumable by the electrical device is the power value band of greater than 0 W and equal to or less than a value of rated power of the electrical device.

7. The training data generation device according to claim 1, further comprising:
a monitoring waveform data acquisition unit that acquires monitoring waveform data including at least one of the current consumption waveform, the input voltage waveform, and the power consumption waveform along the time axis of the electrical device which is a monitoring target;
a collation unit that performs a collation process using a monitoring feature amount which is a feature amount extracted from the monitoring waveform data and the training feature amount of the electrical device stored in the storage unit; and
an output unit that outputs the representative power value associated with the training feature amount matching the monitoring feature amount as the power consumption value of the electrical device.

8. An electrical device monitoring system comprising:
the training data generation device according to claim 1; and
a monitoring device that infers an operation state of each monitoring electrical device which is a monitoring target using the training feature amount of the electrical device generated by the training data generation device,
wherein the monitoring device includes
a monitoring waveform data acquisition unit that acquires monitoring waveform data including at least one of a current consumption waveform, an input voltage waveform, and a power consumption waveform of the electrical device,
a collation unit that performs a collation process using a monitoring feature amount which is a feature amount extracted from the monitoring waveform data and the training feature amount of the electrical device generated by the training data generation device, and
an output unit that outputs the representative power value associated with the training feature amount matching the monitoring feature amount as the power consumption value of the electrical device.

9. A non-transitory storage medium storing a program causing a computer to function as:
a measurement data acquisition unit that acquires measurement data including waveform data including at least one of a current consumption waveform, an input voltage waveform, and a power consumption waveform along a time axis of an electrical device which is a target of a process of generating training data and power consumption value data indicating time-series power consumption values of the electrical device;
an analysis unit that analyzes a rate of occurrence of each power consumption value using the power consumption value data;
a specifying unit that specifies one or more specific power consumption value bands including a power consumption value with the higher rate of occurrence than that of a standard power consumption value and having a predetermined power value width;
a feature amount extraction unit that determines a representative power value and extracts a feature amount using the waveform data for each specific power consumption value band; and
a storage unit that stores a pair of the representative power value determined based on each specific power consumption value band and a training feature amount which is the feature amount in association with the electrical device.

10. A training data generation method performed by a computer, the method comprising:
a measurement data acquisition step of acquiring measurement data including waveform data including at least one of a current consumption waveform, an input voltage waveform, and a power consumption waveform along a time axis of an electrical device which is a target of a process of generating training data and power consumption value data indicating time-series power consumption values of the electrical device;
an analysis step of analyzing a rate of occurrence of each power consumption value using the power consumption value data;
a specifying step of specifying one or more specific power consumption value bands including a power consumption value with the higher rate of occurrence than that of a standard power consumption value and having a predetermined power value width;
a feature amount extraction step of deciding a representative power value and extracting a feature amount using the waveform data for each specific power consumption value band; and
a storage step of storing a pair of the representative power value determined based on each specific power consumption value band and a training feature amount which is the feature amount in association with the electrical device in a storage device.

* * * * *